(12) United States Patent
Koepp et al.

(10) Patent No.: US 10,846,583 B1
(45) Date of Patent: Nov. 24, 2020

(54) HIGH-SPEED RFID TAG ASSEMBLY USING IMPULSE HEATING

(71) Applicant: Impinj, Inc., Seattle, WA (US)

(72) Inventors: Ronald Lee Koepp, Snoqualmie, WA (US); Harley Heinrich, Snohomish, WA (US); Christopher J. Diorio, Shoreline, WA (US)

(73) Assignee: Impinj, Inc., Seattle, WA (US)

( * ) Notice: Subject to any disclaimer, the term of this patent is extended or adjusted under 35 U.S.C. 154(b) by 436 days.

(21) Appl. No.: 15/789,339

(22) Filed: Oct. 20, 2017

Related U.S. Application Data

(63) Continuation of application No. 14/327,207, filed on Jul. 9, 2014, now Pat. No. 9,846,833, which is a continuation-in-part of application No. 13/776,346, filed on Feb. 25, 2013, now Pat. No. 8,881,373.

(60) Provisional application No. 61/844,826, filed on Jul. 10, 2013.

(51) Int. Cl.
  *G06K 19/077* (2006.01)
  *H01Q 1/22* (2006.01)

(52) U.S. Cl.
  CPC ..... *G06K 19/07754* (2013.01); *H01Q 1/2225* (2013.01)

(58) Field of Classification Search
  None
  See application file for complete search history.

(56) References Cited

U.S. PATENT DOCUMENTS

| | | | |
|---|---|---|---|
| 7,260,882 B2 * | 8/2007 | Credelle | G06K 19/07749 29/592.1 |
| 7,420,469 B1 | 9/2008 | Oliver | |
| 7,973,719 B2 | 7/2011 | Igarashi | |
| 8,188,927 B1 | 5/2012 | Koepp et al. | |
| 8,614,506 B1 | 12/2013 | Fassett et al. | |
| 8,661,652 B1 | 3/2014 | Koepp et al. | |
| 8,881,373 B1 | 11/2014 | Koepp et al. | |
| 9,070,066 B1 | 5/2015 | Oliver et al. | |
| 9,317,799 B1 | 4/2016 | Koepp et al. | |
| 9,436,902 B1 | 9/2016 | Koepp et al. | |
| 9,846,833 B1 | 12/2017 | Koepp et al. | |
| 2004/0183182 A1 | 9/2004 | Swindlehurst et al. | |

(Continued)

FOREIGN PATENT DOCUMENTS

EP 2562692 A1 2/2013

OTHER PUBLICATIONS

Office Action received for U.S. Appl. No. 14/451,416, dated Feb. 12, 2016 and filed on Aug. 4, 2014.

(Continued)

*Primary Examiner* — Kristy A Haupt
(74) *Attorney, Agent, or Firm* — Hertzberg, Turk & Associates, LLC

(57) ABSTRACT

RFID inlays or straps may be assembled using impulse heating of metal precursors. Metal precursors are applied to and/or included in contacts on an RFID IC and/or terminals on a substrate. During assembly of the tag, the IC is disposed onto the substrate such that the IC contacts physically contact either the substrate terminals or metal precursors that in turn physically contact the substrate terminals. Impulse heating is then used to rapidly apply heat to the metal precursors, processing them into metallic structures that electrically couple the IC contacts to the substrate terminals.

7 Claims, 12 Drawing Sheets

(56) References Cited

U.S. PATENT DOCUMENTS

2005/0242997 A1 11/2005 Dunn et al.
2006/0092079 A1 5/2006 Rochemont
2014/0144992 A1 5/2014 Diorio et al.

OTHER PUBLICATIONS

Non-Final Office Action Received for U.S. Appl. No. 15/041,041 dated Jan. 26, 2018, 22 pages.

* cited by examiner

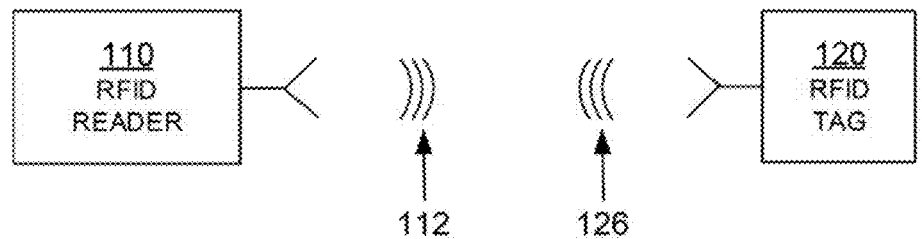
FIG. 1 (PRIOR ART)
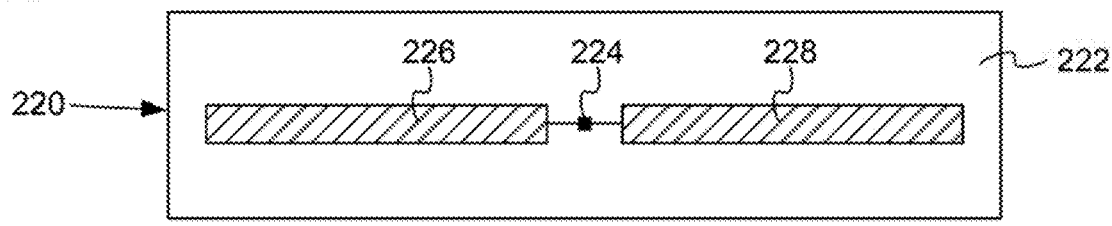
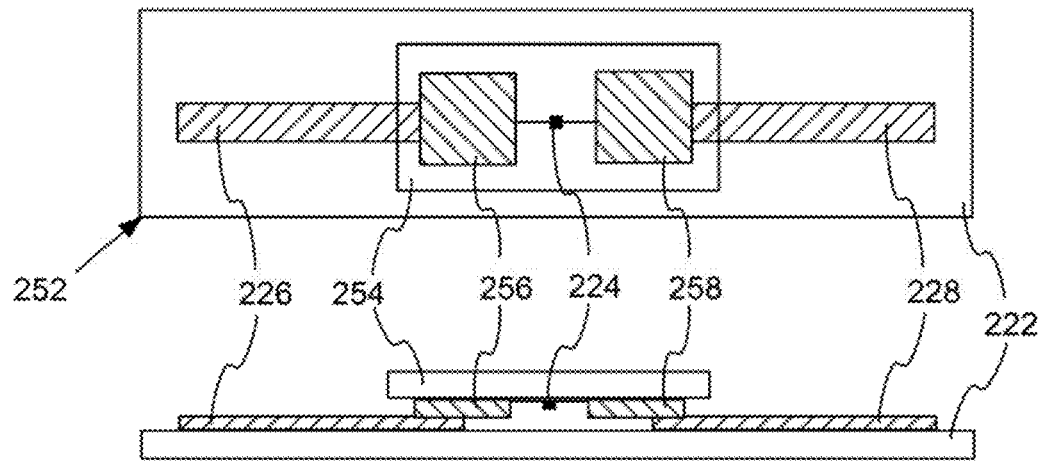
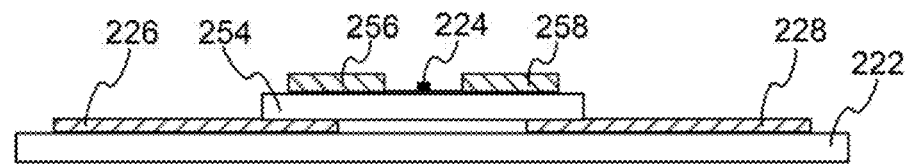
FIG. 2 (PRIOR ART)

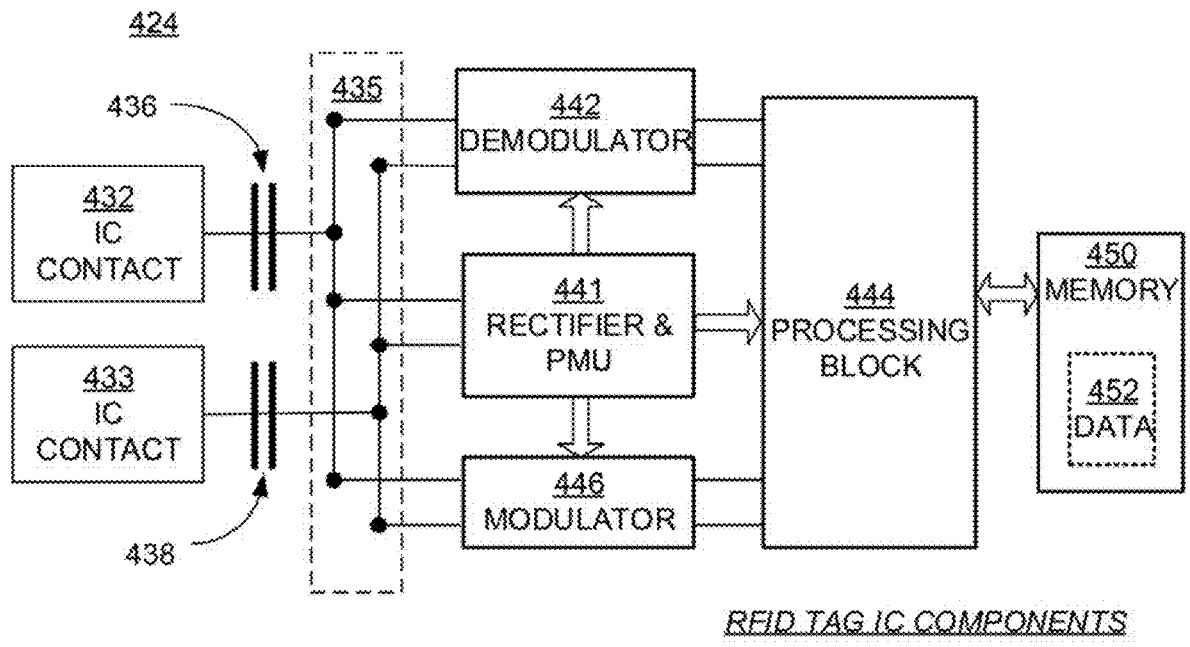
FIG. 4
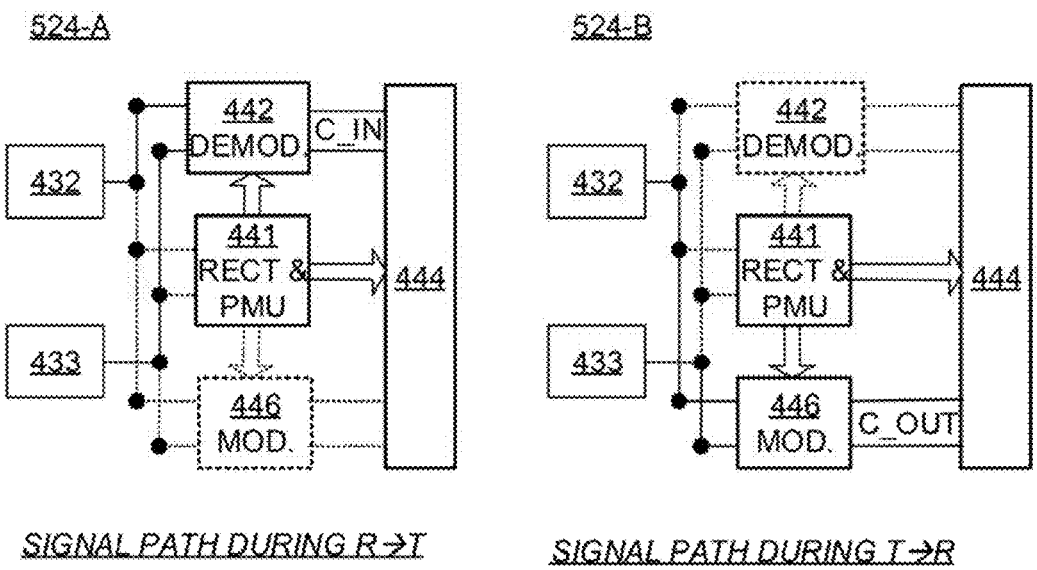
FIG. 5A  FIG. 5B

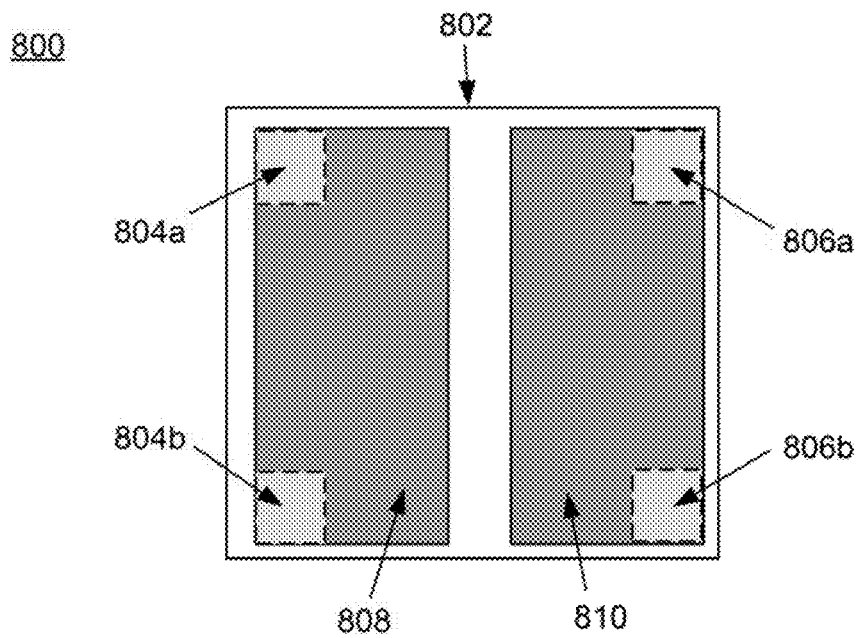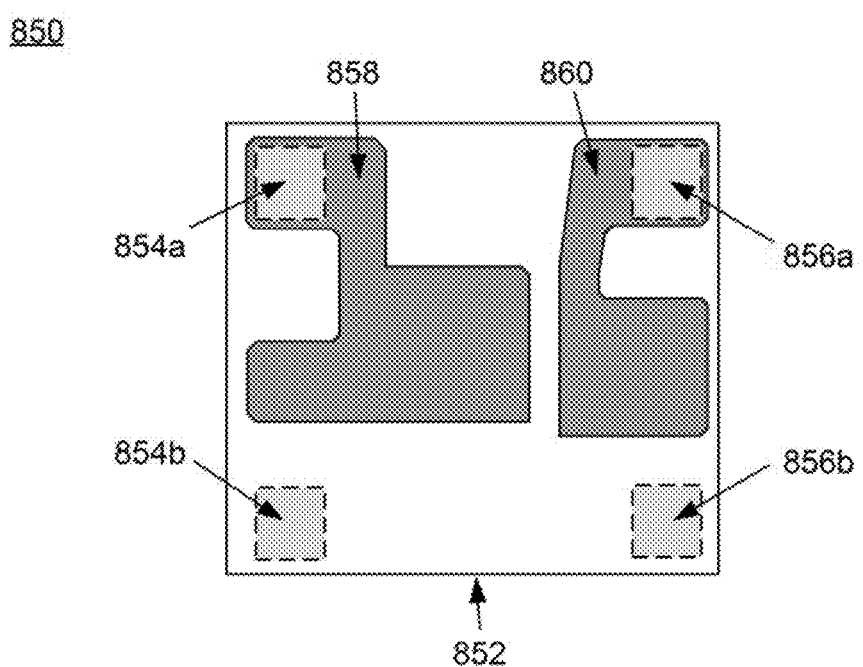
FIG. 8

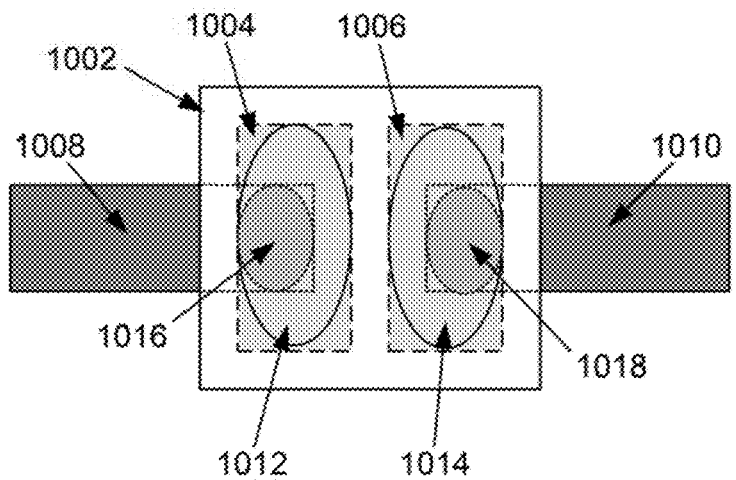
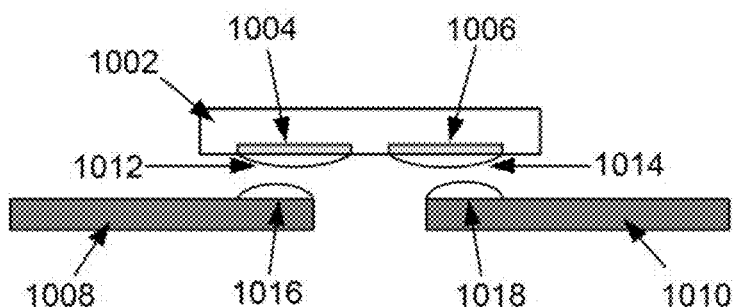
FIG. 10

HIGH-SPEED RFID TAG ASSEMBLY USING IMPULSE HEATING

CROSS REFERENCE TO RELATED APPLICATIONS

This Application is a continuation under 35 U.S.C. § 120 of co-pending U.S. patent application Ser. No. 14/327,207 filed on Sep. 9, 2014, which is a continuation-in-part of U.S. patent application Ser. No. 13/776,346 filed on Feb. 25, 2013, now U.S. Pat. No. 8,881,373 issued in Nov. 11, 2014. This application also claims the benefit of U.S. Provisional Patent Application Ser. No. 61/844,826 filed on Jul. 10, 2013. The disclosures of the above patent applications are hereby incorporated by reference for all purposes.

BACKGROUND

Radio-Frequency Identification (RFID) systems typically include RFID readers, also known as RFID reader/writers or RFID interrogators, and RFID tags. RFID systems can be used in many ways for locating and identifying objects to which the tags are attached. RFID systems are useful in product-related and service-related industries for tracking objects being processed, inventoried, or handled. In such cases, an RFID tag is usually attached to an individual item, or to its package.

In principle, RFID techniques entail using an RFID reader to interrogate one or more RFID tags. The reader transmitting a Radio Frequency (RF) wave performs the interrogation. The RF wave is typically electromagnetic, at least in the far field. The RF wave can also be predominantly electric or magnetic in the near field. The RF wave may encode one or more commands that instruct the tags to perform one or more actions.

A tag that senses the interrogating RF wave may respond by transmitting back another RF wave. The tag either generates the transmitted back RF wave originally, or by reflecting back a portion of the interrogating RF wave in a process known as backscatter. Backscatter may take place in a number of ways.

The reflected-back RF wave may encode data stored in the tag, such as a number. The response is demodulated and decoded by the reader, which thereby identifies, counts, or otherwise interacts with the associated item. The decoded data can denote a serial number, a price, a date, a destination, other attribute(s), any combination of attributes, and so on. Accordingly, when a reader receives tag data it can learn about the item that hosts the tag and/or about the tag itself.

An RFID tag typically includes an antenna section, a radio section, a power-management section, and frequently a logical section, a memory, or both. In some RFID tags the power-management section included an energy storage device such as a battery. RFID tags with an energy storage device are known as battery-assisted, semi-active, or active tags. Other RFID tags can be powered solely by the RF signal they receive. Such RFID tags do not include an energy storage device and are called passive tags. Of course, even passive tags typically include temporary energy- and data/flag-storage elements such as capacitors or inductors.

BRIEF SUMMARY

This summary is provided to introduce a selection of concepts in a simplified form that are further described below in the Detailed Description. This summary is not intended to identify key features or essential features of the claimed subject matter, nor is it intended as an aid in determining the scope of the claimed subject matter.

Embodiments are directed to assembling RFID inlays or straps using impulse heating of metal precursors. Metal precursors are applied to and/or included in contacts on an RFID IC and/or terminals on a substrate. During assembly of the tag, the IC is disposed onto the substrate such that the IC contacts physically contact either the substrate terminals or metal precursors that in turn physically contact the substrate terminals. Impulse heating is then used to rapidly apply heat to the metal precursors, processing them into metallic structures that electrically couple the IC contacts to the substrate terminals.

These and other features and advantages will be apparent from a reading of the following detailed description and a review of the associated drawings. It is to be understood that both the foregoing general description and the following detailed description are explanatory only and are not restrictive of aspects as claimed.

BRIEF DESCRIPTION OF THE DRAWINGS

The following Detailed Description proceeds with reference to the accompanying Drawings, in which:

FIG. 1 is a block diagram of components of an RFID system.

FIG. 2 is a diagram showing components of a passive RFID tag, such as a tag that can be used in the system of FIG. 1.

FIG. 4 is a block diagram showing a detail of an RFID tag, such as the one shown in FIG. 2.

FIGS. 5A and 5B illustrate signal paths during tag-to-reader and reader-to-tag communications in the block diagram of FIG. 4.

FIG. 8 depicts patterned contact pads according to embodiments.

FIG. 10 illustrates a tag assembly method according to embodiments.

DETAILED DESCRIPTION

Figure 3:
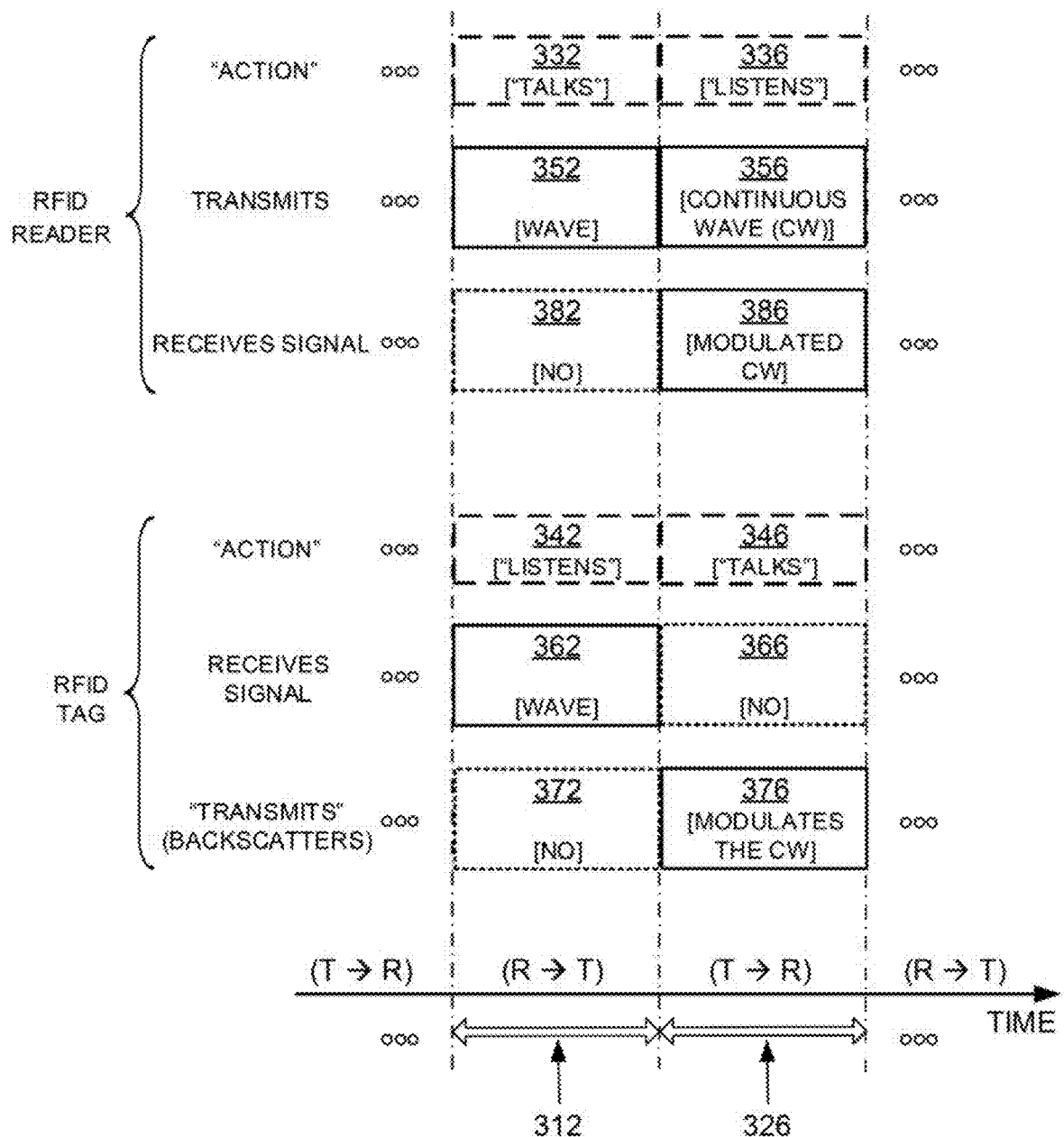
FIG. 3 is a conceptual diagram for explaining a half-duplex mode of communication between the components of the RFID system of FIG. 1.

In the following detailed description, references are made to the accompanying drawings that form a part hereof, and in which are shown by way of illustration specific embodiments or examples. These embodiments or examples may be combined, other aspects may be utilized, and structural changes may be made without departing from the spirit or scope of the present disclosure. The following detailed description is therefore not to be taken in a limiting sense, and the scope of the present invention is defined by the appended claims and their equivalents.

As used herein, "memory" is one of ROM, RAM, SRAM, DRAM, NVM, EEPROM, FLASH, Fuse, MRAM, FRAM, and other similar information-storage technologies as will be known to those skilled in the art. Some portions of memory may be writeable and some not. "Command" refers to a reader request for one or more tags to perform one or more actions, and includes one or more tag instructions preceded by a command identifier or command code that identifies the command and/or the tag instructions. "Instruction" refers to a request to a tag to perform a single explicit action (e.g., write data into memory). "Program" refers to a request to a tag to perform a set or sequence of instructions (e.g., read a value from memory and, if the read value is less than a threshold then lock a memory word). "Protocol" refers to an industry standard for communications between a reader and a tag (and vice versa), such as the Class-1 Generation-2 UHF RFID Protocol for Communications at 860 MHz-960 MHz by GSI EPCglobal, Inc. ("Gen2 Specification"), versions 1.2.0 and 2.0 of which are hereby incorporated by reference.

FIG. 1 is a diagram of the components of a typical RFD system 100, incorporating embodiments. An RFID reader 110 transmits an interrogating RF signal 112. RFID tag 120 in the vicinity of RFID reader 110 senses interrogating RF signal 112 and generate signal 126 in response. RFID reader 110 senses and interprets signal 126. The signals 112 and 126 may include RF waves and/or non-propagating RF signals (e.g., reactive near-field signals).

Reader 110 and tag 120 communicate via signals 112 and 126. When communicating, each encodes, modulates, and transmits data to the other, and each receives, demodulates, and decodes data from the other. The data can be modulated onto, and demodulated from, RF waveforms. The RF waveforms are typically in a suitable range of frequencies, such as those near 900 MHz, 13.56 MHz, and so on.

The communication between reader and tag uses symbols, also called RFID symbols. A symbol can be a delimiter, a calibration value, and so on. Symbols can be implemented for exchanging binary data, such as "0" and "1", if that is desired. When symbols are processed by reader 110 and tag 120 they can be treated as values, numbers, and so on.

Tag 120 can be a passive tag, or an active or battery-assisted tag (i.e., a tag having its own power source). When tag 120 is a passive tag, it is powered from signal 112.

FIG. 2 is a diagram of an RFID tag 220, which may function as tag 120 of FIG. 1. Tag 220 is drawn as a passive tag, meaning it does not have its own power source. Much of what is described in this document, however, applies also to active and battery-assisted tags.

Tag 220 is typically (although not necessarily) formed on a substantially planar inlay 222, which can be made in many ways known in the art. Tag 220 includes a circuit which may be implemented as an IC 224. In some embodiments IC 224 is implemented in complementary metal-oxide semiconductor (CMOS) technology. In other embodiments IC 224 may be implemented in other technologies such as bipolar junction transistor (BJT) technology, metal-semiconductor field-effect transistor (MESFET) technology, and others as will be well known to those skilled in the art. IC 224 is arranged on inlay 222.

Tag 220 also includes an antenna for exchanging wireless signals with its environment. The antenna is often flat and attached to inlay 222. IC 224 is electrically coupled to the antenna via suitable IC contacts (not shown in FIG. 2). The term "electrically coupled" as used herein may mean a direct electrical connection, or it may mean a connection that includes one or more intervening circuit blocks, elements, or devices. The "electrical" part of the term "electrically coupled" as used in this document shall mean a coupling that is one or more of ohmic/galvanic, capacitive, and/or inductive. Similarly, the term "electrically isolated" as used herein means that electrical coupling of one or more types (e.g., galvanic, capacitive, and/or inductive) is not present, at least to the extent possible. For example, elements that are electrically isolated from each other are galvanically isolated from each other, capacitively isolated from each other, and/or inductively isolated from each other. Of course, electrically isolated components will generally have some unavoidable stray capacitive or inductive coupling between them, but the intent of the isolation is to minimize this stray coupling to a negligible level when compared with an electrically coupled path.

IC 224 is shown with a single antenna port, comprising two IC contacts electrically coupled to two antenna segments 226 and 228 which are shown here forming a dipole. Many other embodiments are possible using any number of ports, contacts, antennas, and/or antenna segments.

Diagram 250 depicts top and side views of tag 252, formed using a strap. Tag 252 differs from tag 220 in that it includes a substantially planar strap substrate 254 having strap contacts 256 and 258. IC 224 is mounted on strap substrate 254 such that the IC contacts on IC 224 electrically couple to strap contacts 256 and 258 via suitable connections (not shown). Strap substrate 254 is then placed on inlay 222 such that strap contacts 256 and 258 electrically couple to antenna segments 226 and 228. Strap substrate 254 may be affixed to inlay 222 via pressing, an interface layer, one or more adhesives, or any other suitable means.

Diagram 260 depicts a side view of an alternative way to place strap substrate 254 onto inlay 222. Instead of strap substrate 254's surface, including strap contacts 256/258, facing the surface of inlay 222, strap substrate 254 is placed with its strap contacts 256/258 facing away from the surface of inlay 222. Strap contacts 256/258 can then be either capacitively coupled to antenna segments 226/228 through strap substrate 254, or conductively coupled using a through-via which may be formed by crimping strap contacts 256/258 to antenna segments 226/228. In some embodiments the positions of strap substrate 254 and inlay 222 may be reversed, with strap substrate 254 mounted beneath strap substrate 222 and strap contacts 256/258 electrically coupled to antenna segments 226/228 through inlay 222. Of course, in yet other embodiments strap contacts 256/258 may electrically couple to antenna segments 226/228 through both inlay 222 and strap substrate 254.

In operation, the antenna receives a signal and communicates it to IC 224, which both harvests power and responds if appropriate, based on the incoming signal and the IC's internal state. If IC 224 uses backscatter modulation then it responds by modulating the antenna's reflectance, which generates response signal 126 from signal 112 transmitted by the reader. Electrically coupling and uncoupling the IC contacts of IC 224 can modulate the antenna's reflectance, as can varying the admittance of a shunt-connected circuit element which is coupled to the IC contacts. Varying the impedance of a series-connected circuit element is another means of modulating the antenna's reflectance.

In the embodiments of FIG. 2, antenna segments 226 and 228 are separate from IC 224. In other embodiments the antenna segments may alternatively be formed on IC 224. Tag antennas according to embodiments may be designed in any form and are not limited to dipoles. For example, the tag antenna may be a patch, a slot, a loop, a coil, a horn, a spiral, a monopole, microstrip, stripline, or any other suitable antenna.

The components of the RFID system of FIG. 1 may communicate with each other in any number of modes. One such mode is called full duplex. Another such mode is called half-duplex, and is described below.

FIG. 3 is a conceptual diagram 300 for explaining half-duplex communications between the components of the RFID system of FIG. 1, in this case with tag 120 implemented as passive tag 220 of FIG. 2. The explanation is made with reference to a TIME axis, and also to a human metaphor of "talking" and "listening". The actual technical implementations for "talking" and "listening" are now described.

RFID reader 110 and RFID tag 120 talk and listen to each other by taking turns. As seen on axis TIME, when reader 110 talks to tag 120 the communication session is designated as "R→4", and when tag 120 talks to reader 110 the communication session is designated as "T→R". Along the TIME axis, a sample R→T communication session occurs during a time interval 312, and a following sample T→R communication session occurs during a time interval 326. Of course interval 312 is typically of a different duration than interval 326—here the durations are shown approximately equal only for purposes of illustration.

According to blocks 332 and 336, RFID reader 110 talks during interval 312, and listens during interval 326. According to blocks 342 and 346, RFID tag 120 listens while reader 110 talks (during interval 312), and talks while reader 110 listens (during interval 326).

In terms of actual behavior, during interval 312 reader 110 talks to tag 120 as follows. According to block 352, reader 110 transmits signal 112, which was first described in FIG. 1. At the same time, according to block 362, tag 120 receives signal 112 and processes it to extract data and so on. Meanwhile, according to block 372, tag 120 does not backscatter with its antenna, and according to block 382, reader 110 has no signal to receive from tag 120.

During interval 326, tag 120 talks to reader 110 as follows. According to block 356, reader 110 transmits a Continuous Wave (CW) signal, which can be thought of as a carrier that typically encodes no information. This CW signal serves both to transfer energy to tag 120 for its own internal power needs, and also as a carrier that tag 120 can modulate with its backscatter. Indeed, during interval 326, according to block 366, tag 120 does not receive a signal for processing. Instead, according to block 376, tag 120 modulates the CW emitted according to block 356 so as to generate backscatter signal 126. Concurrently, according to block 386, reader 110 receives backscatter signal 126 and processes it.

FIG. 4 is a block diagram showing a detail of an RFID IC, such as IC 224 in FIG. 2. Electrical circuit 424 in FIG. 4 may be formed in an IC of an RFID tag, such as tag 220 of FIG. 2. Circuit 424 has a number of main components that are described in this document. Circuit 424 may have a number of additional components from what is shown and described, or different components, depending on the exact implementation.

Circuit 424 shows two IC contacts 432, 433, suitable for coupling to antenna segments such as antenna segments 226/228 of RFID tag 220 of FIG. 2. When two IC contacts form the signal input from and signal return to an antenna they are often referred-to as an antenna port. IC contacts 432, 433 may be made in any suitable way, such as from metallic pads and so on. In some embodiments circuit 424 uses more than two IC contacts, especially when tag 220 has more than one antenna port and/or more than one antenna.

Circuit 424 includes signal-routing section 435 which may include signal wiring, signal-routing busses, receive/transmit switches, and so on that can route a signal to the components of circuit 424. In some embodiments IC contacts 432/433 couple galvanically and/or inductively to signal-routing section 435. In other embodiments (such as is shown in FIG. 4) circuit 424 includes optional capacitors 436 and/or 438 which, if present, capacitively couple IC contacts 432/433 to signal-routing section 435. This capacitive coupling causes IC contacts 432/433 to be galvanically decoupled from signal-routing section 435 and other circuit components.

Capacitive coupling (and resultant galvanic decoupling) between IC contacts 432 and/or 433 and components of circuit 424 is desirable in certain situations. For example, in some RFID tag embodiments IC contacts 432 and 433 may galvanically connect to terminals of a tuning loop on the tag. In this situation, capacitors 436 and/or 438 galvanically decouple IC contact 432 from IC contact 433, thereby preventing the formation of a short circuit between the IC contacts through the tuning loop.

Capacitors 436/438 may be implemented within circuit 424 and/or partly or completely external to circuit 424. For example, a dielectric or insulating layer on the surface of the IC containing circuit 424 may serve as the dielectric in capacitor 436 and/or capacitor 438. As another example, a dielectric or insulating layer on the surface of a tag substrate (e.g., inlay 222 or strap substrate 254) may serve as the dielectric in capacitors 436/438. Metallic or conductive layers positioned on both sides of the dielectric layer (i.e., between the dielectric layer and the IC and between the dielectric layer and the tag substrate) may then serve as terminals of the capacitors 436/438. The conductive layers may include IC contacts (e.g., IC contacts 432/433), antenna segments (e.g., antenna segments 226/228), or any other suitable conductive layers.

Circuit 424 also includes a rectifier and PMU (Power Management Unit) 441 that harvests energy from the RF signal received by antenna segments 226/228 to power the circuits of IC 424 during either or both reader-to-tag (R→T) and tag-to-reader (T→R) sessions. Rectifier and PMU 441 may be implemented in any way known in the art.

Circuit 424 additionally includes a demodulator 442 that demodulates the RF signal received via IC contacts 432, 433. Demodulator 442 may be implemented in any way known in the art, for example including a slicer, an amplifier, and so on.

Circuit 424 further includes a processing block 444 that receives the output from demodulator 442 and performs operations such as command decoding, memory interfacing, and so on. In addition, processing block 444 may generate an output signal for transmission. Processing block 444 may be implemented in any way known in the art, for example by combinations of one or more of a processor, memory, decoder, encoder, and so on.

Circuit 424 additionally includes a modulator 446 that modulates an output signal generated by processing block 444. The modulated signal is transmitted by driving IC contacts 432, 433, and therefore driving the load presented by the coupled antenna segment or segments. Modulator 446 may be implemented in any way known in the art, for example including a switch, driver, amplifier, and so on.

In one embodiment, demodulator 442 and modulator 446 may be combined in a single transceiver circuit. In another embodiment modulator 446 may modulate a signal using backscatter. In another embodiment modulator 446 may include an active transmitter. In yet other embodiments demodulator 442 and modulator 446 may be part of processing block 444.

Circuit 424 additionally includes a memory 450 to store data 452. At least a portion of memory 450 is preferably implemented as a Nonvolatile Memory (NVM), which means that data 452 is retained even when circuit 424 does not have power, as is frequently the case for a passive RFID tag.

In some embodiments, particularly in those with more than one antenna port, circuit 424 may contain multiple demodulators, rectifiers, PMUs, modulators, processing blocks, and/or memories.

In terms of processing a signal, circuit 424 operates differently during a R→T session and a T→R session. The different operations are described below, in this case with circuit 424 representing an IC of an RFID tag.

FIG. 5A shows version 524-A of components of circuit 424 of FIG. 4, further modified to emphasize a signal operation during a R→T session during time interval 312 of FIG. 3. Demodulator 442 demodulates an RF signal received from IC contacts 432, 433. The demodulated signal is provided to processing block 444 as C_IN. In one embodiment, C_IN may include a received stream of symbols.

Version 524-A shows as relatively obscured those components that do not play a part in processing a signal during a R→T session. Rectifier and PMU 441 may be active, such as for converting RF power. Modulator 446 generally does not transmit during a R→T session, and typically does not interact with the received RF signal significantly, either because switching action in section 435 of FIG. 4 decouples modulator 446 from the RF signal, or by designing modulator 446 to have a suitable impedance, and so on.

Although modulator 446 is typically inactive during a R→T session, it need not be so. For example, during a R→T session modulator 446 could be adjusting its own parameters for operation in a future session, and so on.

FIG. 5B shows version 524-B of components of circuit 424 of FIG. 4, further modified to emphasize a signal operation during a T→R session during time interval 326 of FIG. 3. Processing block 444 outputs a signal C_OUT. In one embodiment, C_OUT may include a stream of symbols for transmission. Modulator 446 then modulates C_OUT and provides it to antenna segments such as segments 226/228 of RFID tag 220 via IC contacts 432, 433.

Version 524-B shows as relatively obscured those components that do not play a part in processing a signal during a T→R session. Rectifier and PMU 441 may be active, such as for converting RF power. Demodulator 442 generally does not receive during a T→R session, and typically does not interact with the transmitted RF signal significantly, either because switching action in section 435 of FIG. 4 decouples demodulator 442 from the RF signal, or by designing demodulator 442 to have a suitable impedance, and so on.

Although demodulator 442 is typically inactive during a T→R session, it need not be so. For example, during a T→R session demodulator 442 could be adjusting its own parameters for operation in a future session, and so on.

In typical embodiments, demodulator 442 and modulator 446 are operable to demodulate and modulate signals according to a protocol, such as the Gen2 Specification mentioned above. In embodiments where circuit 424 includes multiple demodulators and/or modulators, each may be configured to support different protocols or different sets of protocols. A protocol specifies, in part, symbol encodings, and may include a set of modulations, rates, timings, or any other parameter associated with data communications. In addition, a protocol can be a variant of a stated specification such as the Gen2 Specification, for example including fewer or additional commands than the stated specification calls for, and so on. In such instances, additional commands are sometimes called custom commands.

An RFID tag may be manufactured by physically attaching an RFID IC to a tag inlay having a substrate and an antenna, and electrically coupling the RFID IC to the antenna. For example, the RFID IC may be pressed onto the tag inlay and then electrically coupled to the antenna via one or more contact bumps on the IC and/or on the antenna. However, one challenge with this manufacturing method is that the mounting force for pressing the IC and the tag inlay together may vary from tag to tag, in turn affecting the electrical properties and performance of the completed tag. An RFID IC and its coupled antenna form a tuned circuit whose tuning varies, in part, with the amount of unwanted parasitic capacitive coupling between circuits in the IC and the antenna. This parasitic mounting capacitance can be quantified as:

$$C = \varepsilon_0 \varepsilon_r \frac{A}{d} \quad [1]$$

where $\varepsilon_0$ is the free-space permittivity, $\varepsilon_r$ is the relative permittivity, A is the area of the overlap between the antenna and the circuits, and d is the distance between the antenna and the circuits. Ideally, the area A varies by only a small amount, both because an RFID IC can typically be placed onto the inlay with good placement accuracy, and because the overlap is approximately constant even if the IC is not placed accurately because this capacitance is distributed over the entire area of the IC-to-antenna overlap. The distance d, however can change significantly with the mounting force applied during the mounting process, causing correspondingly significant changes in capacitance C. Hence, variations in mounting force result in tags with varying mounting capacitances and therefore varying tuning.

In embodiments, a nonconductive repassivation layer may be used to reduce variations in mounting capacitance. The repassivation layer may cover a surface of the IC, be disposed between the IC and a substrate, or be disposed between IC contact pads and the rest of the IC. In some embodiments the repassivation layer mitigates mounting-capacitance variations by ensuring a fixed distance between the circuits of the IC and the antenna layer. In other embodiments the repassivation layer mitigates parasitic capacitance variations between circuits of the IC and large IC contact pads, again by ensuring a fixed distance between these circuits and the contact pads.

Figure 6:
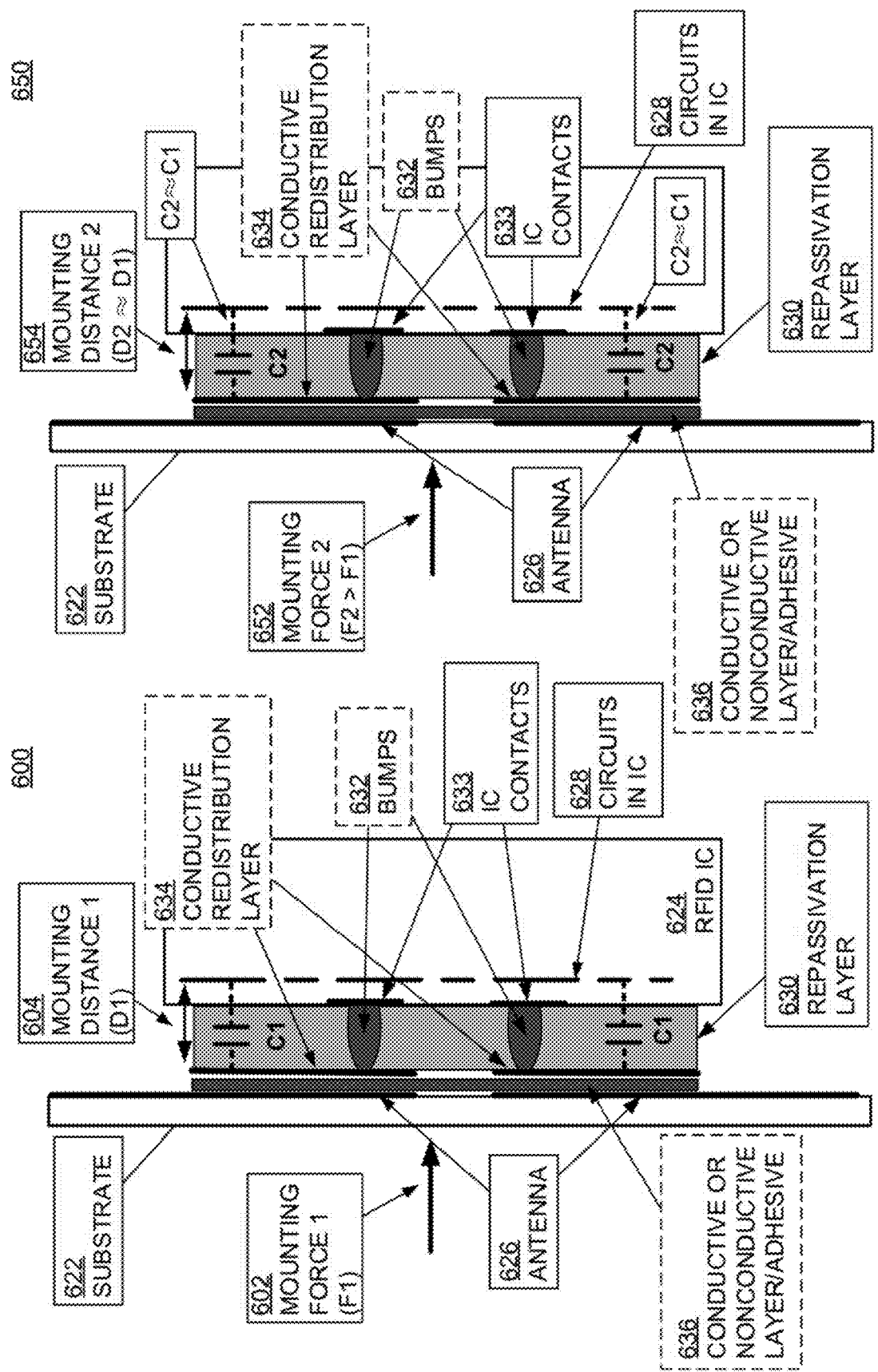
FIG. 6 illustrates tag antenna mounting with a repassivation layer to reduce variations in mounting capacitance between an IC and a tag antenna layer according to embodiments.

FIG. 6 illustrates IC-to-tag antenna mounting with a repassivation layer to reduce mounting-capacitance variations.

FIG. 6 shows a diagram 600 in which an RFID strap or inlay comprising substrate 622 and antenna terminals 626 is pressed against RFID IC 624 with a mounting force F1

(602), where antenna terminals 626 are separated from IC 624 by at least a repassivation layer 630. Mounting distance D1 (604) is fixed by repassivation layer 630, producing a similarly fixed mounting capacitance C1.

Diagram 650 shows the RFD strap or inlay being pressed against the RFID IC with a mounting force F2 (652) which is larger than mounting force F1 (602). The repassivation layer 630 ensures that mounting distance D2 (654) is substantially the same as mounting distance D1 (604) despite the larger mounting force F2. As a result, mounting capacitance C2 is substantially similar to mounting capacitance C1, helping ensure that the tags have similar tuning and consequent similar performance.

In some embodiments a conductive redistribution layer 634 covers a large portion of the surface of either RFID IC 624 or repassivation layer 630. Conductive redistribution layer 634 may be metal (e.g., copper, aluminum, gold, palladium, or any other suitable metal), doped silicon, graphene, or another material that is electrically conductive or possesses metallic properties. Conductive redistribution layer 634 may be applied or deposited on repassivation layer 630, for example by evaporation, sputtering, or direct transfer.

Repassivation layer 630 and/or conductive redistribution layer 634 may be confined within at least a portion of a surface of IC 624. For example, repassivation layer 630 may be confined within the perimeter of IC 624, and redistribution layer 634 may be confined within the perimeter of repassivation layer 630. In other embodiments, repassivation layer 630 and/or redistribution layer 634 may extend beyond the perimeter of IC 624. For example, at least a portion of repassivation layer 630 may extend beyond the perimeter of IC 624, or at least a portion of redistribution layer 634 may extend beyond the perimeter of repassivation layer 630. In some embodiments, the portions of repassivation layer 630/redistribution layer 634 that extend beyond a perimeter of the underlying surface (e.g., that of IC 624 or repassivation layer 630) may be removed by stripping, etching, or as a by-product of singulating IC 624. In other embodiments, the extended portions of repassivation layer 630/redistribution layer 634 may wrap around or encroach onto one or more neighboring surfaces of the IC, or may extend out from the IC surface in a cantilevered fashion.

Repassivation layer 630 and/or conductive redistribution layer 634 may also be deposited or processed to have a particular pattern. For example, repassivation layer 630 may have a pattern of any desired shape that uncovers all or a portion of IC contacts 633, uncovers other portions of the surface of IC 624, and/or covers an entire surface of IC 624. Similarly, redistribution layer 634 may be patterned to form contact pads, strips, or any other desired shape, and may cover all or a portion of IC contacts 633. The patterning of repassivation layer 630 and/or redistribution layer 634 may be performed using a masking step to define the desired pattern (e.g., with a masking layer) and an etching step (if masking occurs after layer deposition) or a liftoff/removal step (if masking occurs before layer deposition). In some embodiments, repassivation layer 630 and/or redistribution layer 634 may be applied to another substrate, optionally patterned, and then transferred to IC 624.

In some embodiments, repassivation layer 630 may include an air gap that separates conductive redistribution layer 634 from IC 624 to further decouple the two capacitively. The air gap may be bridged by support pillar(s) between conductive redistribution layer 634 and IC 624 (including contacts that electrically couple the two). In some embodiments, conductive redistribution layer 634 may employ a metallic or conductive mesh structure to further reduce the capacitive coupling.

Conductive redistribution layer 634 may comprise a single or multiple portions. For example, conductive redistribution layer 634 on repassivation layer 630 may be patterned to provide multiple contact areas electrically isolated from each other. In some embodiments, conductive redistribution layer 634 may also help to protect the underlying repassivation layer 630 during IC fabrication. For example, conductive redistribution layer 634 may serve as an etch mask that covers and prevents etching or damage to underlying portions of repassivation layer 634 during processing like that described in U.S. Pat. No. 7,482,251 issued on Jan. 27, 2009, the entirety of which is hereby incorporated by reference.

As described above, repassivation layer 630 may have a pattern that uncovers at least a portion of IC contacts 633. For example, repassivation layer 630 may be patterned to leave openings over at least a portion of IC contacts 633, or may be patterned such that at least a portion of IC contacts 633 lie outside the periphery of repassivation layer 630. By contrast, redistribution layer 634 may have a pattern that covers at least a portion of IC contacts 633. In some embodiments, a first pattern of repassivation layer 630 and a second pattern of redistribution layer 634 may be chosen such that the portions of C contacts 633 uncovered by the first pattern at least partially coincide with the portions of IC contacts 633 that are covered by the second pattern.

Redistribution layer 634 may be galvanically (i.e., conductively) connected to the portion(s) of IC contacts 633 uncovered by the first pattern and covered by the second pattern. In some embodiments, the second pattern may be deposited directly over portions of IC contacts 633 uncovered by the first pattern and processed to form galvanic connections to IC contacts 633 without the need for bumps or other intermediaries. For example, redistribution layer 634 may be deposited over openings in repassivation layer 630 that uncover portions of IC contacts 633, or may be deposited to extend beyond the periphery of repassivation layer 630 if portions of IC contacts 633 lie outside the periphery of repassivation layer 630. This latter embodiment is described in more detail below in FIG. 7. In other embodiments one or more bumps 632 may galvanically connect redistribution layer 634 and IC contacts 633.

In some embodiments, IC contacts 633 may be electrically coupled to redistribution layer 634 without uncovering portions of IC contacts 633. For example, portions of repassivation layer 630 may be made conductive, for example by doping via ion implantation, allowing IC contacts 633 to galvanically connect with redistribution layer 634 through these conductive portions. In another example, IC contacts 633 may capacitively couple to conductive redistribution layer 634 through repassivation layer 630. For example, repassivation layer 630 may serve as a capacitor dielectric between IC contacts 633 and conductive redistribution layer 634. In cases where multiple, separate portions of conductive redistribution layer 634 exist, multiple capacitors may be formed between the separate portions of conductive redistribution layer 634 and corresponding IC contacts, where each distinct capacitor may be coupled to distinct electrical circuits of the IC such as a rectifier circuit, a demodulator circuit, or a modulator circuit, thus enabling these circuits to be at different DC potentials. According to other embodiments, another antenna terminal may be affixed to a second surface of the IC (opposite the first surface) forming another capacitor (or set of capacitors) on the surface of the chip. In cases with multiple capacitors (and/or two-sided coupling), one or more connections may instead be galvanic by providing a direct contact between the antenna trace and one or more large contact pads on the IC.

Repassivation layer 630 may be an organic or inorganic material, typically (although not necessarily) with a relatively low dielectric constant and a reasonable thickness to minimize parasitic coupling capacitance as described above. Examples of organic materials include but are not limited to polyimide-based materials, Spheron™ WLP manufactured by RoseStreet Labs based in Phoenix, Ariz., or benzocyclobutene-based materials (e.g., bisbenzocyclobutene, BCB). An additional layer 636 may be applied between the IC and the strap/inlay to attach the IC to the strap/inlay, physically and/or electrically. Layer 636 may include an anisotropic conductive adhesive or layer, a patterned conductive adhesive or layer, and/or a nonconductive adhesive or layer. If layer 636 is nonconductive then it is typically sufficiently thin as to provide low-impedance capacitive coupling between antenna terminals 626 and conductive redistribution layer 634 at the frequencies of RFID communications. Whereas FIG. 6 shows layer 636 contacting both of the terminals of antenna 626 and both portions of conductive redistribution layer 634, in some embodiments layer 636 may be patterned to prevent antenna terminals 626 from coupling with each other, or to prevent portions of conductive redistribution layer 634 from coupling with each other. For example, layer 636 may be patterned such that a portion of conductive redistribution layer 634 only galvanically couples with one of the antenna terminals, and does not galvanically couple with the other antenna terminal or with other portions of conductive redistribution layer 634. Of course, in some embodiments layer 636 may not be present at all.

Figure 7:
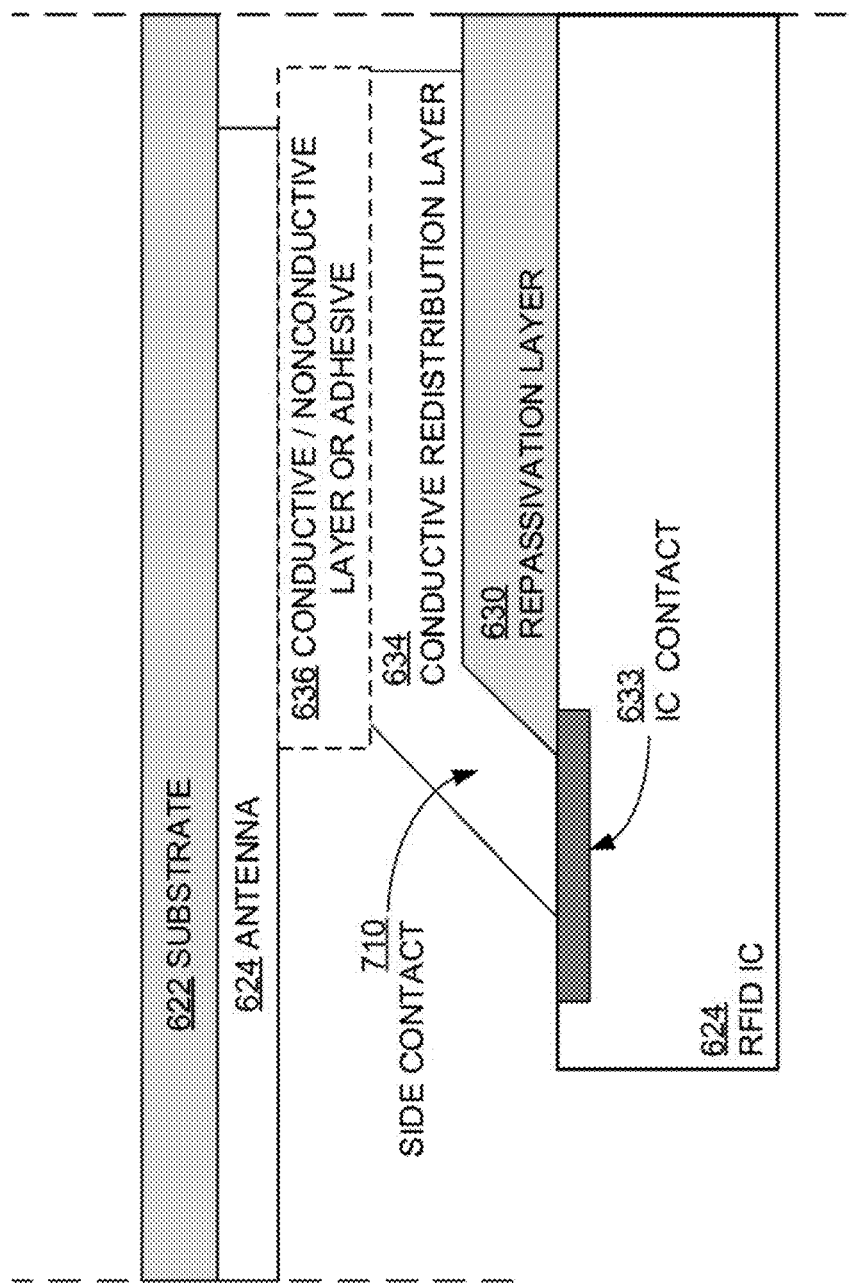
FIG. 7 illustrates a detailed cross-section of a conductive redistribution layer electrically coupling to an IC contact according to embodiments.

FIG. 7 illustrates a cross-section 700 of conductive redistribution layer 634 electrically coupling to IC contact 633 according to embodiments. As shown in cross-section 700, repassivation layer 630 is disposed on RFID IC 624 so as to at least partially cover one of its surfaces, leaving other portions of the surface uncovered. In FIG. 7 as shown, repassivation layer 630 optionally leaves uncovered a portion of IC contact 633. Also in FIG. 7 as shown, in some embodiments at least part of an edge of repassivation layer 630 may be sloped or beveled. Conductive redistribution layer 634 may be disposed on IC 624 so as to extend from the top of repassivation layer 630 down its sloped/beveled side, forming what may be referred to as a "side contact". Side contact 710 may further extend beyond the periphery of repassivation layer 630 and over at least a portion of IC contact 633, coupling galvanically or capacitively to a portion of IC contact 633. In some embodiments the extension of side contact 710 may couple to IC contact 633 directly, without intermediate contacts, bumps, or layers. In other embodiments one or more conductive and/or nonconductive contacts, bumps or layers may be interposed between the extension of side contact 710 and IC contact 633.

Conductive redistribution layer 634 also electrically couples to antenna 624 directly or through an optional conductive/nonconductive layer or adhesive 636, as described above. In some embodiments, in particular those similar to diagram 700, the region of electrical coupling between conductive redistribution layer 634 and antenna 624 substantially nonoverlaps the region of electrical coupling between conductive redistribution layer 634 and IC contact 633. In other words, the projection of the electrical interface area between conductive redistribution layer 634 and antenna 624 onto the surface of the IC 624 does not overlap the projection of the electrical interface area between conductive redistribution layer 634 and IC contact 633.

As described above, in many cases RFID ICs can be placed onto an inlay with relatively good placement accuracy. Accurate alignment of an IC to an inlay antenna allows proper coupling between the IC contacts and the antenna terminals. One way to couple the IC to the antenna terminals involves using metallic posts, also known as bumps. However, in some situations using bumps for coupling may be undesirable. Bumps form a stress point on the IC, reducing its strength and potentially resulting in IC breakage during further processing.

In embodiments according to the present invention, one or more relatively large conductive contact pads formed on the IC may be used instead of (or in addition to) bumps. Diagram 800 in FIG. 8 depicts a top view of IC 802 having large contact pads 808 and 810. In diagram 800 each large contact pad is electrically coupled to IC 802 via a pair of IC contacts, but more or fewer IC contacts can be used. In some embodiments the large contract pads 808 and 810 are galvanically coupled to the IC contacts, whereas in other embodiments the coupling may be capacitive or inductive.

As depicted in diagram 800, large contact pad 808 is electrically coupled to IC 802 via IC contacts 804a and 804b, and large contact pad 810 is electrically coupled to IC 802 via IC contacts 806a and 806b. Large contact pads 808 and 810 are, in turn, configured to provide capacitive or galvanic coupling to external electrical elements such as the antenna terminals on an RFID strap or inlay (e.g., antenna terminals 626). Large contact pads 808 and 810 provide more area for coupling to these external electrical elements, and as a result reduce the coupling impedance. They also reduce performance variations due to IC-to-antenna alignment accuracy because the predominant parasitic capacitive coupling is IC-to-contact pad rather than IC-to-antenna, and the IC-to-contact-pad alignment is typically very well controlled because the large contact pads are fabricated on IC 802.

In some embodiments, a dielectric or repassivation layer (e.g., repassivation layer 630) is first deposited on IC 802, and large contact pads 808/810 are formed on the repassivation layer and then electrically coupled to the IC contacts. The coupling between the large contact pads and the IC contacts may be capacitive or galvanic. When capacitive, the coupling may be adjusted via the dielectric characteristics (e.g. composition, thickness) of the material disposed between the contact pads and the antenna (e.g., layer 636). This material may be nonconductive material covering the pads, nonconductive material covering the antenna traces (e.g. a naturally grown or enhanced oxide layer on aluminum traces), and/or any additional dielectric material. Galvanic coupling may be enhanced by pressing an antenna onto the IC such that one or more "dimples" formed on the antenna make direct contact with one or more of the large contact pads on the IC. In some embodiments, the dimples are instead formed on the large contact pads. In some embodiment the dimples break through the nonconductive covering material. In other embodiments, galvanic coupling may be accomplished without dimples or bumps, such as by direct contact or by means of an etchant to remove the nonconductive covering material.

Large contact pads 808/810 may cover a significant portion of the top surface of IC 802. For example, large contact pads 808/810 may cover more than 20%, 30%, 40%, 50%, 60%, 70%, 80%, 90%, or even up to 100% of the top surface of IC 802. Regardless of the amount of coverage, large contact pads 808/810 are distinguishable from bumps by their predisposition to have at least one of (1) a surface area that is a significant fraction of the size of underlying IC 802, (2) a surface area that is many times larger than that of underlying IC contacts 633, (3) a low aspect ratio (height versus width or height versus surface area), and/or (4) a flat or textured-flat top. By contrast, bumps typically have (1) a surface area that is small relative to the size of underlying IC 802, (2) a surface area that is similar or perhaps twice that of underlying IC contacts 633, (3) a high aspect ratio (height versus width or height versus surface area), and (4) a rounded top. In addition, large contact pads 808/810 tend to have an as-designed shape, whereas bumps tend to assume a shape similar that of their underlying IC contacts (i.e. circular-looking if the underlying bumps are circular or octagonal-looking if the underlying IC contacts are octagonal). Of course, not all of these differences are required or absolute, but a large contact pad is easily distinguishable from a bump by one of ordinary skill in the art.

In some embodiments, the combined area of all contact pads on a particular surface of the IC does not exceed the area of that particular surface, and any contact pads on a surface of an IC are confined within or extend up to that surface's perimeter. In other embodiments, large contact pads may extend out beyond the perimeter of an IC surface and may wrap around or encroach onto neighboring IC surfaces, or even extend outward from the IC surface in a cantilevered fashion.

Whereas large contact pads 808/810 in diagram 800 are shown as substantially rectangular, large contact pads do not need to be rectangular. Large contact pads may be circular, annular, or may be designed to have any suitable shape. Diagram 850 depicts a top view of IC 852 with one IC contact pair having contacts 854a and 854b (similar to contacts 804a and 804b) and another IC contact pair having contacts 856a, 856b (similar to contacts 806a and 806b). Large contact pads 858 and 860 overlie and electrically couple to IC contacts 854a and 856a, respectively. IC contact pads 854b and 856b may remain electrically isolated, may couple to other electrical elements, may have any other purpose, or may not even exist.

Large contact pads 858 and 860 may be fabricated and shaped by patterning a conductive redistribution layer as described above in reference to FIG. 6. The shapes and/or orientations of the contact areas may be based on aesthetics, ease of electrically coupling to antenna terminals, ease of etching or forming, utility as an etch-stop in an etching step, reducing parasitic coupling to sensitive components in IC 802/852, or for any other reason. In some embodiments large contact pads may be patterned so that regions whose local parasitic capacitance to IC 802/852 (or elements in IC 802/852) would exceed a threshold are excised. The portions may be removed after deposition or not deposited in the first place. The threshold(s) may be determined based on, for example, a desired parasitic capacitance of the entire IC or a desired local parasitic capacitance of a portion of the IC. Also as shown in diagram 850, contact areas 808 and 810 may have curved or rounded edges, for example to ease masking, etching, and/or liftoff patterning processes.

In some embodiments, the surface area of a conductive redistribution layer (e.g., redistribution layer 634) or a large contact pad fashioned from such a redistribution layer (e.g., contact pad 808) that is available for electrical coupling to an antenna may be much larger than the surface area of the interface between the redistribution layer and the IC contact (e.g., IC contacts 633 or contact 804a). For example, the surface area of large contact pad 808 is shown to be substantially larger than the total surface area of the interface between large contact pad 808 and IC contacts 804a and 804b. Likewise, the surface area of large contact pad 810 is shown to be substantially larger than the total surface area of the interface between large contact pad 810 and IC contacts 806a and 806b. In some embodiments, the surface area of a large contact pad available for electrical coupling to an antenna may be at least three times (300%), five times (500%), ten times (1000%), or even twenty times (2000%) or more larger than the surface area of the interface between the large contact pad and one or more IC contacts.

Figure 9:
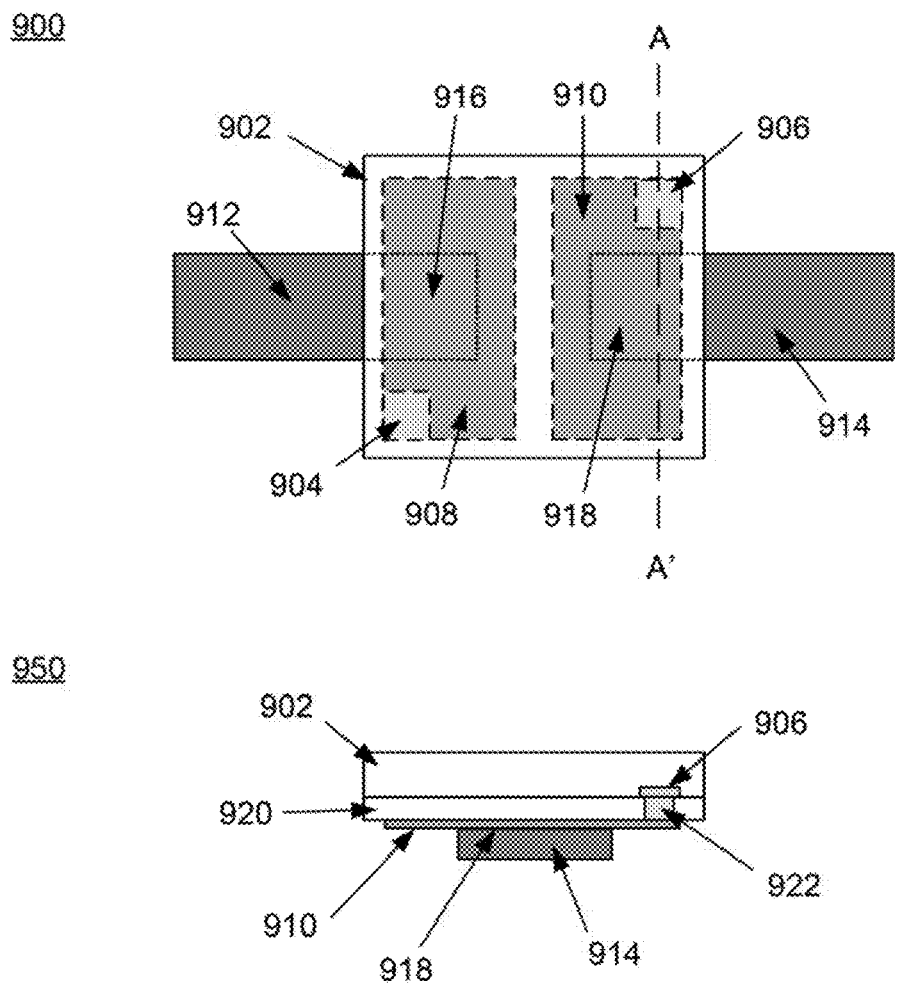
FIG. 9 depicts nonoverlapping or offset contacts according to embodiments.

In some embodiments, a contact location between a contact layer and antenna terminal may differ from a contact location between the contact layer and the IC. Such offset and nonoverlapping connections may provide flexibility in terms of the placement of the IC onto the antenna terminals. FIG. 9 depicts nonoverlapping or offset contacts according to embodiments, and depicts a top view 900 and a cutaway view 950 (taken along the A-A' axis shown in view 900). In FIG. 9, an IC 902 has IC contacts 904 and 906. A repassivation layer 920 is disposed over the IC contacts 904 and 906, and contact pads 908 and 910 are disposed on the repassivation layer 920. The contact pads 908 and 910 may be formed by patterning a deposited contact layer. The IC contacts 904 and 906 are electrically connected through the repassivation layer 920 to the contact pads 908 and 910, respectively. As shown in view 950, IC contact 906 may be electrically connected to contact pad 910 via a bump 922 (similar to bump(s) 632) formed through an opening in the repassivation layer 920. A similar bump (not shown) may electrically connect IC contact 904 to contact pad 908 through another opening in the repassivation layer 920. In some embodiments, the contact pads 910 and 908 may directly electrically connect with the IC contacts 906 and 904, respectively, without bumps. For example, the contact pads 910/908 may be deposited on an opening in the repassivation layer 920, directly forming an electrical connection with underlying IC contacts 906/904.

The contact pads 908 and 910 are further electrically connected to antenna terminals 912 and 914, respectively. In particular, contact pad 908 electrically connects to antenna terminal 912 through contact area 916, and contact pad 910 electrically connects to antenna terminal 914 through contact area 918. If an oxide, masking, or other nonconductive layer covers the contact pads and/or the antenna terminals, openings may be formed at the contact areas 916 and 918 before the electrical connections are made, as described above.

While FIG. 9 depicts connections/openings that are entirely offset and nonoverlapping, in other embodiments the connections/openings may partially overlap, or a connection (e.g., a contact pad/antenna terminal connection) may wholly encompass another connection (e.g., a contact pad/IC contact connection).

Large IC contact pads as described herein may also assist in the positioning of an IC on a substrate. FIG. 10 illustrates a top view 1000 and a side view 1050 of a tag self-assembly method according to embodiments. In FIG. 10, an IC 1002 is to be deposited on a substrate having antenna terminals 1008 and 1010. In particular, IC 1002 is to be deposited such that first IC contact pad 1004 overlaps first antenna terminal 1008 (but not second antenna terminal 1010) and second IC contact pad 1006 overlaps second antenna terminal 1010 (but not first antenna terminal 1008).

Liquid surface tension may be used to facilitate the alignment of each contact pad with its respective antenna terminal. Surface tension results from cohesive forces between liquid molecules. When two droplets of similar liquid (or liquids having similar surface energies) are placed close to each other, they will tend to coalesce into a single, larger droplet in order to minimize the number of exposed molecules and thereby minimize surface energy. If the two droplets are each associated with a different object, the coalescence of the two droplets may also pull the different objects together.

In FIG. 10, at least some of the contact pads and/or the antenna terminals may each be associated with a liquid droplet. For example, contact pad 1004 may be associated with droplet 1012, contact pad 1006 may be associated with droplet 1014, antenna terminal 1008 may be associated with droplet 1016, and antenna terminal 1010 may be associated with droplet 1018. When IC 1002 is brought into close proximity to the substrate (and antenna terminals 1008 and 1010), droplet 1012 may be attracted to droplet 1016, thus drawing IC pad 1004 into contact with antenna terminal 1008. Similarly, droplet 1014 may be attracted to droplet 1018, drawing IC pad 1006 into contact with antenna terminal 1010.

In one embodiment, the liquid droplets 1012-1018 may include water. In some embodiments, the liquid droplets may also include one or more liquid adhesives, such as a conductive, nonconductive, or anisotropically conductive adhesive. Liquid droplets 1012-1018 may result from solid material. For example, a solid film or solid particles may first be deposited on the contact pads and/or the antenna terminals. The deposited solid material may then be heated, chemically modified, or otherwise processed to form the liquid droplets 1012-1018. For example, solid solder may initially be deposited on the contact pads and/or the antenna terminals. Just prior to the assembly process, heat may be applied to IC 1002 and/or the substrate (for example, using impulse heating as described below) in order to melt the solid solder into liquid solder droplets. Subsequently, IC 1002 may be brought into close proximity to the substrate (and antenna terminals 1008 and 1010), and the liquid solder droplets on the IC contact pads and/or the antenna terminals may coalesce to draw the IC and the substrate together. In some embodiments, IC 1002 may be brought into close proximity to the substrate before heat is applied. Subsequently, heat may be applied (e.g., using impulse heating as described below) to melt the solid solder deposited on the contact pads and/or the antenna terminals, which causes contact pads and antenna terminals close to each other to be drawn together (via droplet coalescence). Of course, solid materials other than solder may be used.

In some embodiments, different types of liquids may be used for each pair of IC pad and antenna terminal. For example, a first type of liquid may be placed on IC pad 1004 and antenna terminal 1008, and a second type of liquid may be placed on IC pad 1006 and antenna terminal 1010. The liquid types may be selected to have different surface tension properties, such that droplets of the first type of liquid do not attract droplets of the second type of liquid. For example, droplets of a polar liquid (e.g., water) may be placed on IC pad 1004 and antenna terminal 1008, and droplets of a nonpolar liquid (e.g., an oil) may be placed on IC pad 1006 and antenna terminal 1008. In some embodiments, substances that are liquid under different conditions may be used. For example, water droplets may be placed on IC pad 1004 and antenna terminal 1008, and solid solder may be placed on IC pad 1006 and antenna terminal 1010. When the IC is initially deposited on the substrate, IC pad 1004 and antenna terminal 1008 will be drawn together by their associated water droplets. Subsequently, the IC and substrate may be heated such that the solid solder on IC pad 1006 and antenna terminal 1010 melt and draw the pad and terminal together.

While FIG. 10 depicts liquid droplets on each of the IC pads and antenna terminals, in some embodiments liquid droplets may be present on only one IC pad or antenna terminal in each pair of IC pads and antenna terminals. In these embodiments, the liquid droplet on the IC pad (or antenna terminal) may be preferentially attracted to the material of the antenna terminal (or IC pad). For example, a droplet of a polar liquid (e.g., water) may be preferentially attracted to a metal (e.g., the metal of an IC pad or antenna terminal).

Other techniques may also be used to assemble or align ICs onto antenna terminals on a substrate. As one example, electrostatic attraction may be used to assemble an electrically-charged IC onto oppositely-charged antenna terminals. The charge on the IC and/or antenna terminals may be induced by a laser (e.g., as with laser printing) or by any other suitable means.

As described above, an IC may be galvanically or conductively connected to the conductive trace of an antenna by, for example, using a dimple or bump on the trace to directly connect the trace to a large contact pad on the IC. In some embodiments, an IC contact pad may be galvanically connected to an antenna without the use of a dimple, bump, or raised region.

Figure 11A:
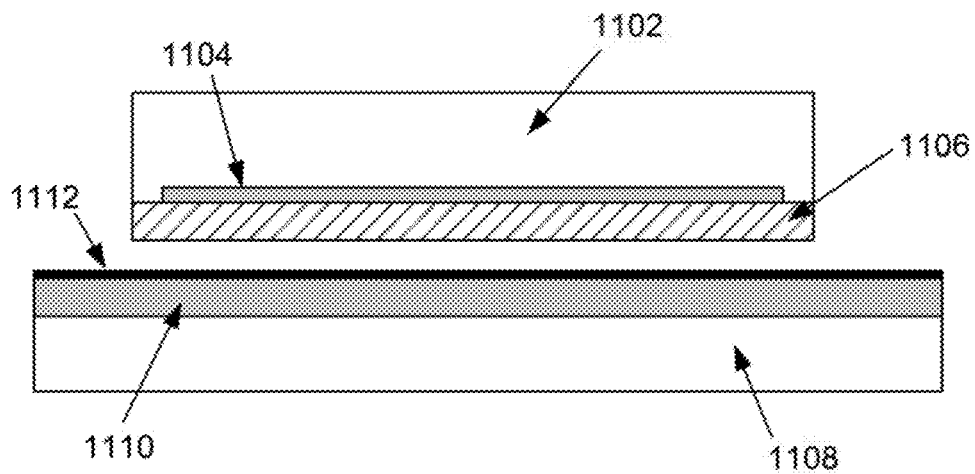
FIGS. 11A and 11B illustrate tag precursors having ICs galvanically connected to antenna terminals on tag substrates according to embodiments.
Figure 11B:
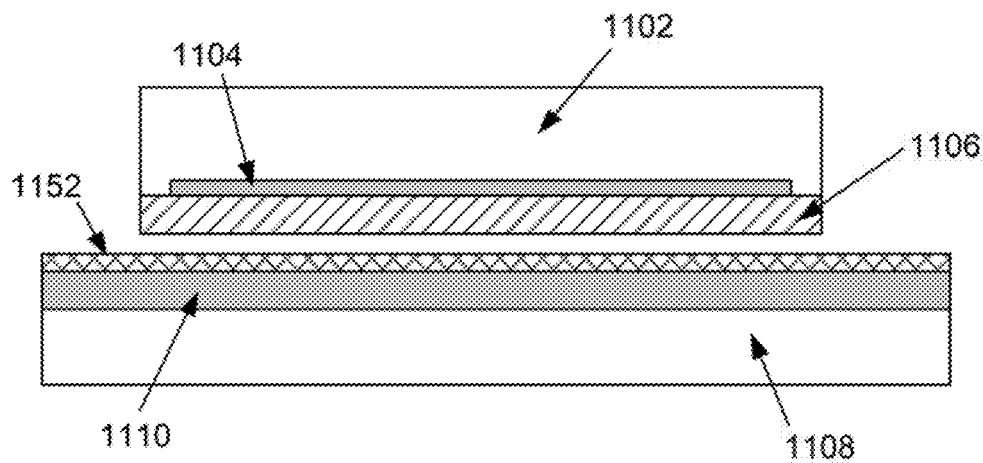

FIGS. 11A and 11B illustrate tag precursors having ICs galvanically connected to antenna terminals on tag substrates according to embodiments. A tag precursor is a portion of a complete RFID tag, and includes the RFID IC and either a substrate having the entire tag antenna (i.e., an inlay) or a substrate having only a portion of the entire tag antenna (i.e., a strap). In the latter case, the strap may then be attached to an inlay.

FIG. 11A depicts an IC 1102 and a tag substrate 1108. IC 1102 includes one or more large contact pads 1104 that electrically connect to one or more electrical circuit elements within IC 1102. Tag substrate 1108, which may be a strap or an inlay, includes an antenna terminal 1110, which may be a trace of metal similar to antenna traces 320 and 322 described in FIG. 3. If antenna terminal 1110 includes an oxidizing metal such as aluminum or copper, an oxide layer 1112 may form on terminal 1110, for example due to exposure to air. Oxide layer 1112, if allowed to remain, acts as an insulating layer which prevents the formation of a galvanic connection between IC pad 1104 and antenna terminal 1110.

To address this issue, an additional layer 1106 may be added to facilitate the formation of a galvanic connection between IC pad 1104 and antenna terminal 1110. In some embodiments, additional layer 1106 includes etchants for forming openings by etching or breaking through oxide layer 1112. For example, additional layer 1106 may include particles (spherical, ovoid, angular, sharp-edged, etc.) that form openings in the oxide layer 1112 by rupturing it when heat and/or pressure are applied. In one embodiment, particles suspended in a fast-drying binder or liquid may be applied to the IC 1102 or the substrate 1108 and then dried to form the additional layer 1106.

Additional layer 1106 may also (or instead) include substance(s) for etching or reacting with oxide layer 1112 to form openings. In some embodiments, such substances may include compounds for chemically reducing oxides (i.e., decreasing the oxidation state of an oxygen-containing compound by adding electrons to the compound), such as solder flux or any other suitable acidic compound or substance. The particular substances used may be selected based on the material to be etched/reacted with. For example, if antenna terminal 1110 includes aluminum, additional layer 1106 may include an etchant or reducing substance for aluminum oxide. When IC 1102 with additional layer 1106 is disposed on antenna terminal 1110, components in additional layer 1106 (e.g., the particles and/or substances described above) create openings in oxide layer 1112, thus allowing IC pad 1104 to form a galvanic connection with antenna terminal 1110. In some embodiments, heat and/or pressure may be applied to additional layer 1106 to facilitate the creation of openings in oxide layer 1112 and the formation of galvanic connections between IC pad 1104 and antenna terminal 1110. For example, applying heat to an etchant, reactant, or reducing substance may accelerate the oxide etch/reaction/reduction process.

In some embodiments, the additional layer 1106 may include an adhesive for attaching the IC 1102 to the tag substrate 1108. For example, the adhesive may include an isotropic or anisotropic conductive material and/or a non-conductive adhesive. In some embodiments, the adhesive may also include one or more of the mechanical and/or chemical etchants or reactants described herein (e.g., particles, etchants, reducing substances, solubilizing substances, dopants, etc.), while in other embodiments the adhesive may be separate from the etchant(s).

If the additional layer 1106 is electrically conductive, the galvanic connection between IC pad 1104 and antenna terminal 1110 may be formed through the additional layer 1106. For example, if the additional layer 1106 includes conductive particles for forming openings in the oxide layer 1112, the conductive particles may help form the galvanic connection. If the additional layer 1106 is not electrically conductive, it may be removed as a result of applied heat, pressure, or other processing, thus allowing IC pad 1104 to directly contact antenna terminal 1110 to form a galvanic connection (e.g., after applying pressure, heat, or some other processing). In some embodiments, the IC pad 1104 itself may have a textured surface (e.g., surface irregularities, ridges, protrusions, and/or other topological features) for etching or rupturing oxide layer 1112 when heat and/or pressure is applied. For example, the IC pad 1104 may be fabricated to include relatively sharp-edged ridges or bumps on its surface in a patterned or random arrangement. In some embodiments, laser-assisted etching or other methods of selective etching may be used to provide surface texturing on the IC pad 1104.

FIG. 11B depicts a diagram 1150 similar to diagram 1100 in FIG. 11A. However, instead of an oxide layer, a masking layer 1152 covers antenna terminal 1110. Masking layer 1152 may be deposited after antenna terminal 1110 is formed to serve as a protective layer that prevents the formation of an oxide layer on the antenna terminal. The masking layer 1152 may include an organic or inorganic dielectric material, or may even include a metallic or other electrically-conductive material that preferably does not oxidize. If masking layer 1152 includes a dielectric or insulating material, additional layer 1106 may include substance(s) for reacting with, etching, reducing, or solubilizing masking layer 1152 and/or particles that rupture masking layer 1152 when heat and/or pressure is applied. If masking layer 1152 includes an electrically-conductive material, additional layer 1106 may include material for galvanically connecting IC pad 1104 and masking layer 1152, or may not even be present.

While heat and/or pressure applied to an IC or a tag substrate may be used to accelerate the formation of openings in an oxide or masking layer and/or form a galvanic connection (e.g., as described previously), in some embodiments processing other than heat and/or pressure may also be used. For example, an electric field may be applied between IC pad 1104 and antenna terminal 1110. The electric field may facilitate etching of any oxide layer (e.g., oxide layer 1112) by, for example, increasing the etching rate and/or the etching selectivity. The electric field may also facilitate the physical formation of the galvanic connection between IC pad 1104 and antenna terminal 1110 by, for example, electronically welding the pad to the terminal or promoting electromigration of metallic ions such that pad 1104 is electrically shorted to terminal 1110. As another example, ultrasonic welding may be used to disrupt oxide layer 1112 and/or electrically short pad 1104 to terminal 1110.

In some embodiments, reactants or substances in the additional layer 1106 may react with the oxide layer 1112 or the masking layer 1152 to form a conductive pathway between IC pad 1104 and antenna terminal 1110 without having to form openings in the oxide layer 1112 or the masking layer 1152. For example, the masking layer 1152 may include a nonconductive plastic. When the additional layer 1106 is in contact with the masking layer 1152, dopants in the layer 1106 may diffuse into portions of the masking layer 1152, turning those portions conductive and creating the conductive pathway. In some embodiments, heat and/or pressure may be used to facilitate the diffusion/reaction.

In some embodiments, low-melting-point metals (e.g., solder as described above) or metal precursors may be used to form electrical connections between IC contacts and substrate terminals/contacts. A "metal precursor" is a material that can be processed to form electrically-conductive structures electrically coupling two contacts or terminals. Processing of a metal precursor includes the application of heat and/or pressure to the metal precursor to at least partially melt, sinter, or otherwise cause the metal precursor to become an electrically conductive structure. In some embodiments, a metal precursor may be processed to form a physical bond between two other electrically conductive structures (e.g., an IC contact and a substrate terminal/contact).

Metal precursors may be electrically conductive before processing, or may be insulating before processing and electrically conductive after processing. For example, a metal precursor that is electrically conductive before processing may include metal particles or a thin layer of metal without a nonconductive coating (e.g., an oxide). A metal precursor that is electrically conductive after processing may include metal particles or layers coated with a nonconductive material, such as an oxide or other insulating layer, particles formed of metal oxides, metal particles in a nonconductive matrix or carrier, or any other metal-containing compound or material that is relatively electrically-insulating before processing and electrically conductive after processing. Metal precursors may be a thin layer of metal or metallic particles, solder powder, or solder paste, and may include aluminum, tin, palladium, copper, silver, gold, bismuth, any combination of the previous, or any other suitable metal. In some embodiments, metal precursors may include a chemical etchant, reducing substance, or solubilizing substance for etching or reacting with oxides or masking layers, as described above in FIG. 11.

In some embodiments a metal precursor may only be metallic in the sense of being electrically conductive after processing, and may not include a metal at all. For example, a metal precursor may include a nonmetallic organic or inorganic layer that becomes electrically conductive after the application of heat and/or pressure. Regardless of whether a metal precursor actually includes metal or not, in some embodiments the materials in the metal precursor may be capable of forming an electrically-conductive structure upon processing with relatively low heat or pressure. For example, the metal precursor may include one or more low-melting-point metals.

Figure 12:
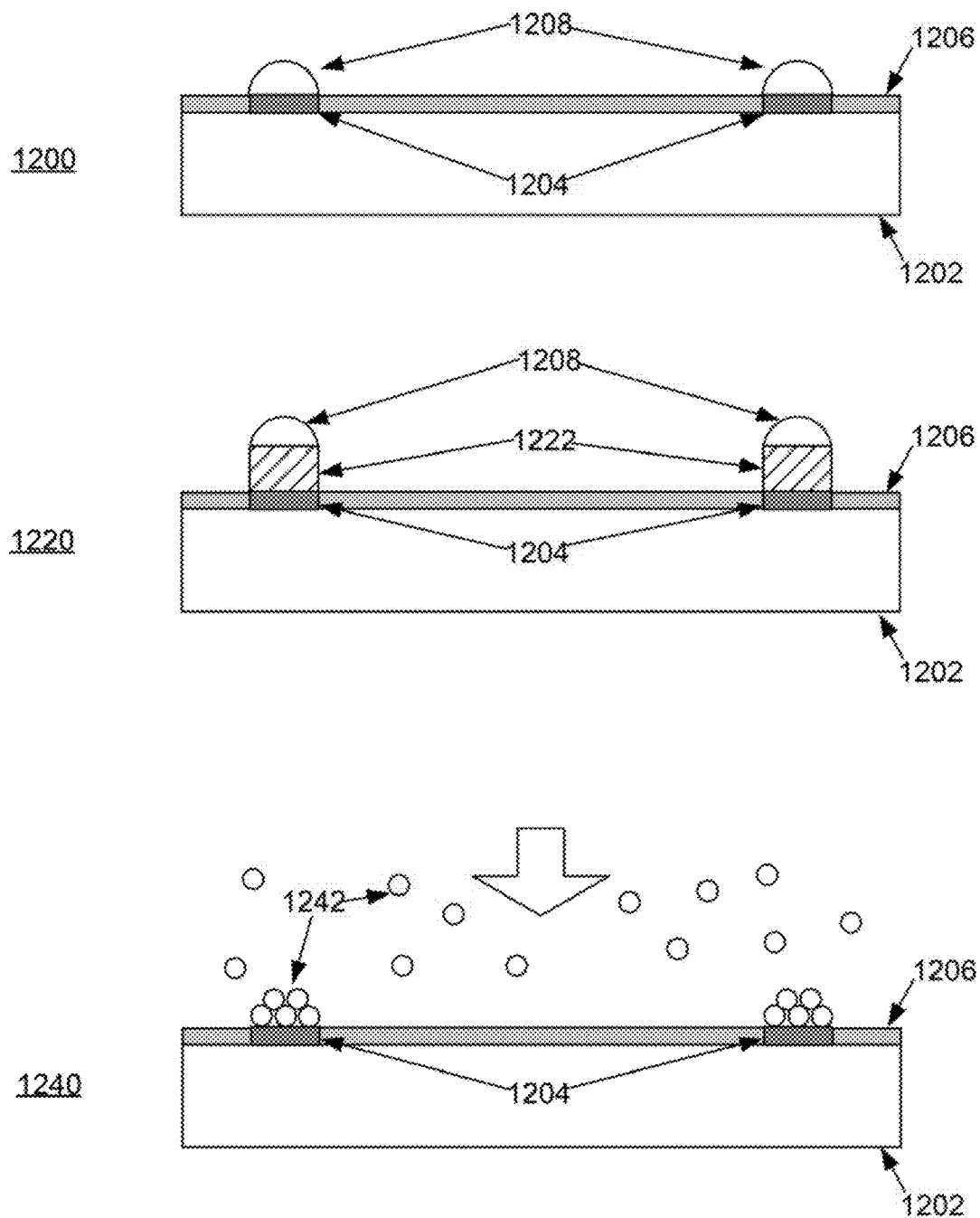
FIG. 12 depicts the deposition of metal precursors on RFID integrated circuits according to embodiments.

FIG. 12 depicts the deposition of metal precursors on RFD integrated circuits according to embodiments. Diagram 1200 depicts an RFID IC 1202 with an insulating layer 1206 and IC contacts 1204 (similar to IC contacts 432 and 433) electrically connected to circuitry within the IC 1202. Structures 1208 (e.g., bumps) are formed of metal precursors as described above, and may be deposited onto the IC 1202 so as to physically contact IC contacts 1204. In some embodiments, structures 1208 may be partially processed after deposition to physically attach and electrically couple to IC contacts 1204. Upon further physical contact with different contacts (e.g., antenna terminals) and subsequent processing, as described below in FIG. 13, structures 1208 may become electrically conductive, thereby electrically coupling IC contacts 1204 to the other contacts or terminals.

Diagram 1220 depicts a similar RFID IC 1202. However, spacers 1222 physically separate structures 1208 from IC contacts 1204. In some embodiments, spacers 1222 may include a conductive material, such as a metal (e.g., copper, aluminum, palladium, gold, or any other suitable metal), and may electrically couple structures 1208 to IC contacts 1204. In some embodiments, structures 1208 may be partially processed after deposition to physically attach and electrically couple to spacers 1222.

Diagram 1240 depicts structures being deposited via a powder-coating process. The RFID IC 1202, similar to the ICs described above, may be electrostatically charged. Electrostatically charged metal precursor particles 1242 may then be applied to the IC 1202. If the polarity of the charge on the particles 1242 opposes the polarity of the charge on the IC 1202, then the particles 1242 will be attracted to and adhere to the IC 1202. In some embodiments, the particles 1242 preferentially adhere to the IC contacts 1204 and avoid the insulating layer 1206. After the particles 1242 are applied to IC 1202, the particles 1242 may be partially processed to cause them to attach and electrically couple to the IC contacts 1204. Subsequently, the partially-processed particles 1242 may be brought into physical contact with other contacts and fully processed to electrically couple IC contacts 1204 with the other contacts, as described above in diagram 1200.

Structures 1208 and particles 1242 may be deposited onto IC contacts 1204 or spacers 1222 in any number of ways. For example, metal precursors may be deposited to form structures 1208 using a masked-coating process, a silk-screening process, a vapor deposition process, an evaporation process, and/or a sputtering process. In some embodiments, the metal precursor may be deposited on IC contacts 1204 during the fabrication of IC 1202 to serve as an oxidation barrier for IC contacts 1204, thereby preventing oxidation of IC contacts 1204. Particles 1242 may be deposited using a powder-coating process (as described above), a masked-coating process, or a silk-screening process.

While metal precursors are described above as being deposited or applied onto ICs, metal precursors may also (or instead) be applied to contacts on an inlay or strap substrate in similar fashion. For example, metal precursors may be deposited using any of the techniques described above onto antenna terminals or strap contacts on a substrate, and then subsequently partially-processed to attach and electrically couple to the substrate terminals/contacts. In some embodiments, antenna terminals or strap contacts on a substrate may be formed using metal precursors. For example, an antenna-terminal precursor (which may include metal precursors) may be deposited on a substrate at a location where an antenna terminal is desired. Similar to a metal precursor, the antenna-terminal precursor may be capable of forming an electrically-conductive structure upon processing with relatively low heat or pressure, and may be electrically conductive before processing, or may be insulating before processing and electrically conductive after processing. In some embodiments the antenna-terminal precursor may not include any metals, and may instead include a nonmetallic organic or inorganic layer that becomes electrically conductive after the application of heat and/or pressure.

The deposited antenna-terminal precursor may then be processed to form a conductive antenna terminal. In some embodiments, an IC may first be placed such that an IC contact physically contacts the antenna-terminal precursor, and the antenna-terminal precursor may then be subsequently processed to form both a conductive antenna terminal and a physical bond/electrical connection between the antenna terminal and the IC contact.

As described above, metal precursors may be processed using heat and/or pressure to form metallic or electrically-conductive structures that physically bond to IC contacts (e.g., C contacts 1204) and antenna terminals. In some embodiments, impulse heating is used to apply heat to metal precursors. Impulse heating refers to a localized heating process where a controlled amount of thermal energy is delivered to a specific target location over a specific time duration, and may be useful because significant amounts of thermal energy can be delivered to specific locations without excessive heating of the surrounding environment, thereby reducing the possibility of environmental damage. For example, if a tag inlay or strap includes an organic polymer, such as polyethylene terephthalate (PET), impulse heating may be used to process metal precursors on the inlay without melting, damaging, or otherwise degrading the organic polymer.

The amount of thermal energy delivered by an impulse heating process may be determined based on the desired effect. For example, when impulse heating is used to process a metal precursor structure such as structure 1208, the amount of thermal energy to be delivered may be determined based on the material characteristics of the metal precursor (e.g., heat capacity and/or melting point), size of the metal precursor (dimensions, volume, and/or mass), desired outcome (e.g., partial melting or sintering of the metal precursor), anticipated losses in delivery (e.g., losses incurred from passing through a medium and/or from dissipation at the target location), and/or material characteristics of the surrounding environment (e.g., the melting point or temperature tolerance of the substrate or IC components).

The target location for the impulse heating process may be determined based on the structure to be processed. For example, when a laser is used for impulse heating of a metal precursor structure, the structure itself may serve as the target location, and the spot size of the laser may be determined based on the amount of thermal energy to be delivered, the time duration of the delivery (as described below), the intervening medium, the material characteristics of the surrounding environment, and/or the structure's size and heat propagation characteristics.

The time duration over which the impulse heating process delivers thermal energy may be determined based on the material of the metal precursor, characteristics of the metal precursor structure, characteristics of the environment surrounding the structure, and/or characteristics of the intervening medium. For example, the time duration may be selected such that the metal precursor structure reaches a first temperature (e.g., over the melting point or sintering temperature of the metal precursor), but does not exceed a second temperature (e.g., a temperature that would damage the environment surrounding the structure). The time duration may be selected to be relatively short, less than a second and on the order of milliseconds, to allow for rapid processing.

Figure 13:
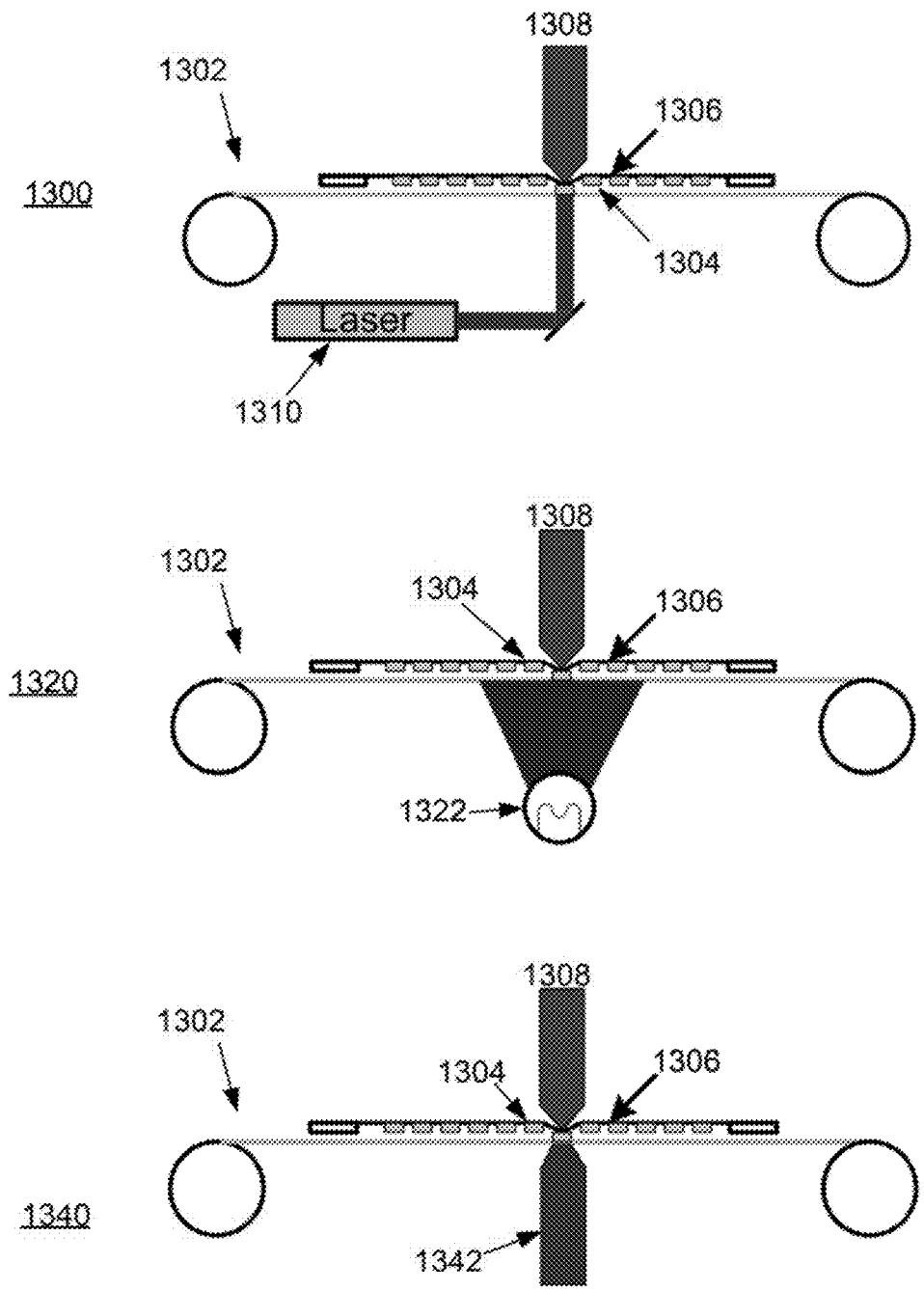
FIG. 13 depicts the assembly of RFID ICs to form tags or straps using impulse heating of metal precursors according to embodiments.

FIG. 13 depicts the assembly of RFID ICs to form inlays or straps using impulse heating of metal precursors according to embodiments. Apparatus 1302 is configured to present inlay or strap substrates for IC placement. Apparatus 1302 includes cylindrical drums or rollers that dispense and gather a flexible backing or web, on which the substrates are mounted. ICs 1304 are mounted on a stretch frame 1306, which allows a place tool 1308 to select an individual IC 1304 for assembly onto a substrate. For example, place tool 1308 may press the back of stretch frame 1306 to bring an IC into physical contact with a substrate, as shown in FIG. 13.

Diagram 1300 depicts a laser-based method for assembling ICs into inlays or straps. The ICs 1304 and/or the substrates may have metal precursor structures, as described above in FIG. 12. When place tool 1308 causes an IC to physically contact a substrate, a laser 1310 may impulse-heat the metal precursor structures by applying heat to the substrate and/or the IC as described above, processing the metal precursor structures into metallic, electrically-conductive structures that electrically couple the IC to antenna terminals or strap contacts on the substrate.

The ICs and/or the substrates may be impulse-heated using other methods. Diagram 1320 depicts an infrared-based method for assembling ICs onto inlays. Diagram 1320 is similar to diagram 1300, but uses an infrared light source 1322 to perform the impulse-heating instead of a laser. Similarly, diagram 1340 depicts a method using a thermode or heating element 1342 to perform the impulse-heating.

Figure 14:
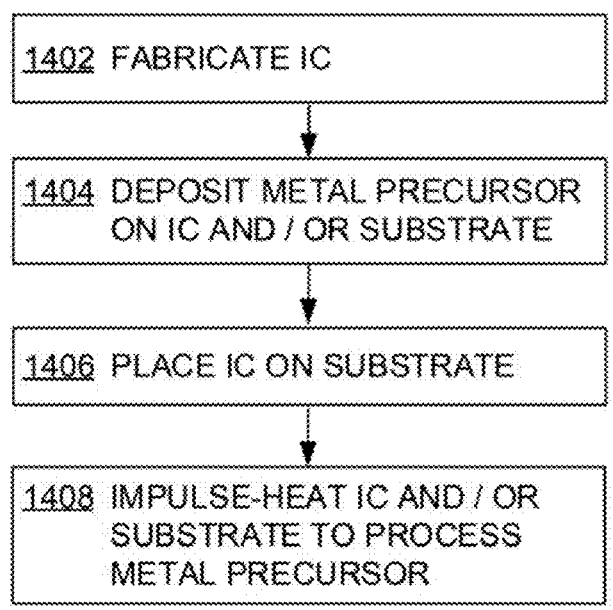
FIG. 14 is a flowchart depicting a process for assembling RFID ICs to form tags or straps using impulse heating of metal precursors according to embodiments.

FIG. 14 is a flowchart depicting a process 1400 for assembling RFID ICs onto inlays using impulse heating of metal precursors according to embodiments. In step 1402, RFID integrated circuits (ICs) are fabricated. IC fabrication includes the formation of IC contacts (e.g., IC contacts 1204 in FIG. 12) and the deposition of insulating layers (e.g., insulating layer 1206 in FIG. 12). The IC fabrication step may also include the deposition of spacers such as spacers 1222 in FIG. 12. In some embodiments, metal precursor layers may also be deposited on IC contacts in step 1402, for example to serve as an oxidation barrier for the IC contacts.

In step 1404, metal precursor structures (e.g., structures 1208 in FIG. 12) are deposited onto the fabricated ICs and/or substrates onto which the ICs are to be assembled. The metal precursor structures may be deposited using any suitable method, such as powder-coating, masked-coating, silk-screening, vapor deposition, evaporation, or sputtering, as described above. If oxides or masking layers are present on the contacts of the ICs and/or antenna terminals on the substrate, a substance that etches, reacts with, or reduces the oxides/masking layers (as described above) may be deposited along with or in addition to the metal precursor structures. For example, the substance may be deposited to cover the metal precursor structures, or may be incorporated into the metal precursor structures. In some embodiments, the metal precursor structures may take the place of antenna terminals on the substrate (as described above) and/or IC contacts.

In step 1406, the IC is placed onto or otherwise brought into contact with the substrate, as described in FIG. 13. Finally, in step 1408 the 1C, the substrate, and/or the metal precursor structures may be impulse-heated as described in FIG. 13 to process the metal precursor structures into metallic conductors electrically coupling the IC to terminals or contacts on the substrate. In embodiments where oxides or masking layers are present and the metal precursor structures include a substance to chemically remove the oxides/masking layers, the impulse heating may heat the substance to accelerate the oxide/masking layer removal process.

The steps described in process 1400 are for illustration purposes only. RFID IC assembly onto substrates using impulse-heating of metal precursors may be performed employing additional or fewer steps and in different orders using the principles described herein. Of course the order of the steps may be modified, some steps eliminated, or other steps added according to other embodiments.

ICs as described herein may also be configured and/or implement functionalities as described in Patent Cooperation Treaty (PCT) Application PCT/US12/54531 filed on Sep. 10, 2012 and U.S. patent application Ser. No. 14/132,959 filed on Dec. 18, 2013. The disclosures of the aforementioned applications are hereby incorporated by reference for all purposes.

Embodiments also include methods of assembling a tag as described herein. An economy is achieved in the present document in that a single description is sometimes given for both methods according to embodiments, and functionalities of devices made according to embodiments.

Embodiments may be implemented using programs executed by fully or partially automated tag manufacturing equipment. A program is generally defined as a group of steps or operations leading to a desired result, due to the nature of the elements in the steps and their sequence. A program is usually advantageously implemented as a sequence of steps or operations for a processor, such as the structures described above.

Performing the steps, instructions, or operations of a program requires manipulation of physical quantities. Usually, though not necessarily, these quantities may be transferred, combined, compared, and otherwise manipulated or processed according to the steps or instructions, and they may also be stored in a computer-readable medium. These quantities include, for example, electrical, magnetic, and electromagnetic charges or particles, states of matter and in the more general case can include the states of any physical devices or elements.

Embodiments may furthermore include storage media for storing the programs discussed above. A storage medium according to the embodiments is a machine-readable medium, such as a memory, and is read by a processor controlling a tag assembly machine for assembling tags according to embodiments. If a memory, it can be implemented in a number of ways, such as Read Only Memory (ROM), Random Access Memory (RAM), etc., some of which are volatile and some nonvolatile.

The above specification, examples and data provide a complete description of the manufacture and use of the composition of the embodiments. Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims and embodiments.

We claim:

1. A Radio Frequency Identification (RFID) tag precursor comprising:
    an assembly including an RFID integrated circuit (IC), a nonconductive repassivation layer on a surface of the IC and confined within a perimeter of the surface, and a conductive redistribution layer on the repassivation layer and confined within the perimeter of the surface, in which at least a portion of the redistribution layer is electrically connected to the IC;
    a substrate including an antenna; and
    a metallic conductor forming an electrical connection between the portion of the redistribution layer and the antenna, wherein:
    the metallic conductor is formed by impulse-heating a first metal precursor that includes a reducing substance;
    at least one of the redistribution layer and the antenna has an oxide layer;
    the impulse heating heats the reducing substance to accelerate the reduction of the oxide layer, thereby forming at least one opening in the oxide layer; and
    the metallic conductor forms the electrical connection through the at least one opening.

2. The tag precursor of claim 1, wherein the first metal precursor includes at least one of solder powder, solder paste, unsintered metal, and a thin metal layer, and includes at least one of tin, palladium, copper, silver, and bismuth.

3. The tag precursor of claim 1, wherein the first metal precursor is applied on the portion of the redistribution layer as an oxidation barrier during the IC fabrication process.

4. The tag precursor of claim 1, wherein the impulse heating uses at least one of a laser, an infrared light source, and a thermode.

5. The tag precursor of claim 1, wherein the antenna is formed by heating a second precursor to process the second precursor into at least a portion of the antenna.

6. The tag precursor of claim 5, wherein the first metal precursor and the second precursor are the same precursor.

7. The tag precursor of claim 1, wherein an electrical connection between the portion of the redistribution layer and the IC is at least one of through the repassivation layer and via a side contact.

* * * * *

UNITED STATES PATENT AND TRADEMARK OFFICE
CERTIFICATE OF CORRECTION

PATENT NO. : 10,846,583 B1
APPLICATION NO. : 15/789339
DATED : November 24, 2020
INVENTOR(S) : Ronald Lee Koepp et al.

Page 1 of 1

It is certified that error appears in the above-identified patent and that said Letters Patent is hereby corrected as shown below:

On the Title Page

Column 2 (Attorney Agent, or Firm), Line 1, Delete "Turk" and insert -- Turk, --, therefor.

In the Specification

In Column 1, Line 9, Delete "Sep." and insert -- Jul. --, therefor.
In Column 3, Line 26, Delete "GSI" and insert -- GS1 --, therefor.
In Column 3, Line 28, Delete "RFD" and insert -- RFID --, therefor.
In Column 5, Line 24, Delete ""R→4"," and insert -- "R→T", --, therefor.
In Column 9, Line 5, Delete "RFD" and insert -- RFID --, therefor.
In Column 10, Line 26, Delete "C" and insert -- IC --, therefor.
In Column 19, Line 9, Delete "RFD" and insert -- RFID --, therefor.
In Column 20, Line 28, Delete "C" and insert -- IC --, therefor.
In Column 22, Line 6, Delete "1C," and insert -- IC, --, therefor.

Signed and Sealed this
Thirtieth Day of March, 2021

Drew Hirshfeld
*Performing the Functions and Duties of the
Under Secretary of Commerce for Intellectual Property and
Director of the United States Patent and Trademark Office*